(12) United States Patent
Kim et al.

(10) Patent No.: US 10,276,467 B2
(45) Date of Patent: Apr. 30, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Eun Sil Kim, Suwon-si (KR); Doo Hwan Lee, Suwon-si (KR); Dae Jung Byun, Suwon-si (KR); Tae Ho Ko, Suwon-si (KR); Yeong A Kim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/440,181

(22) Filed: Feb. 23, 2017

(65) Prior Publication Data
US 2017/0278766 A1  Sep. 28, 2017

(30) Foreign Application Priority Data

Mar. 25, 2016  (KR) .................. 10-2016-0036258
Jul. 1, 2016  (KR) .................. 10-2016-0083565
Aug. 24, 2016  (KR) .................. 10-2016-0107713

(51) Int. Cl.
*H01L 21/56* (2006.01)
*H01L 23/00* (2006.01)
(Continued)

(52) U.S. Cl.
CPC .......... *H01L 23/3128* (2013.01); *H01L 21/56* (2013.01); *H01L 21/563* (2013.01);
(Continued)

(58) Field of Classification Search
CPC ............... H01L 21/563; H01L 23/3114; H01L 23/3128; H01L 23/3135; H01L 23/3142; H01L 23/3171; H01L 23/5389
(Continued)

(56) References Cited

U.S. PATENT DOCUMENTS

| 8,354,304 B2 | 1/2013 | Chow et al. |
| 2007/0044303 A1 | 3/2007 | Yamano |

(Continued)

FOREIGN PATENT DOCUMENTS

| CN | 101785106 A | 7/2010 |
| CN | 102844383 A | 12/2012 |

(Continued)

OTHER PUBLICATIONS

Taiwanese Office Action issued in corresponding Taiwanese Patent Application No. 106105515, dated Jun. 22, 2018, with English Translation.

(Continued)

*Primary Examiner* — Matthew E Warren
(74) *Attorney, Agent, or Firm* — Morgan Lewis & Bockius LLP

(57) ABSTRACT

A fan-out semiconductor package includes: a fan-out semiconductor package may include: a first interconnection member having a through-hole; a semiconductor chip disposed in the through-hole of the first interconnection member and having an active surface having connection pads disposed thereon and an inactive surface opposing the active surface; an encapsulant encapsulating at least portions of the first interconnection member and the inactive surface of the semiconductor chip; a second interconnection member disposed on the first interconnection member and the active surface of the semiconductor chip; and a reinforcing layer disposed on the encapsulant. The first interconnection mem- (Continued)

ber and the second interconnection member respectively include redistribution layers electrically connected to the connection pads of the semiconductor chip.

31 Claims, 22 Drawing Sheets

(51) Int. Cl.
  *H01L 23/29* (2006.01)
  *H01L 23/31* (2006.01)
  *H01L 23/538* (2006.01)
(52) U.S. Cl.
  CPC ........ *H01L 23/295* (2013.01); *H01L 23/3114* (2013.01); *H01L 23/3142* (2013.01); *H01L 23/3171* (2013.01); *H01L 23/5386* (2013.01); *H01L 23/5389* (2013.01); *H01L 24/06* (2013.01); *H01L 24/19* (2013.01); *H01L 24/20* (2013.01); *H01L 21/568* (2013.01); *H01L 23/3135* (2013.01); *H01L 23/562* (2013.01); *H01L 2224/04105* (2013.01); *H01L 2224/05124* (2013.01); *H01L 2224/12105* (2013.01); *H01L 2224/16227* (2013.01); *H01L 2224/211* (2013.01); *H01L 2224/215* (2013.01); *H01L 2224/221* (2013.01); *H01L 2224/32225* (2013.01); *H01L 2224/73204* (2013.01); *H01L 2224/96* (2013.01); *H01L 2225/1035* (2013.01); *H01L 2924/0105* (2013.01); *H01L 2924/01013* (2013.01); *H01L 2924/01022* (2013.01); *H01L 2924/01028* (2013.01); *H01L 2924/01029* (2013.01); *H01L 2924/01047* (2013.01); *H01L 2924/01079* (2013.01); *H01L 2924/01082* (2013.01); *H01L 2924/10252* (2013.01); *H01L 2924/10253* (2013.01); *H01L 2924/10329* (2013.01); *H01L 2924/14* (2013.01); *H01L 2924/1431* (2013.01); *H01L 2924/1432* (2013.01); *H01L 2924/1433* (2013.01); *H01L 2924/1434* (2013.01); *H01L 2924/1436* (2013.01); *H01L 2924/14335* (2013.01); *H01L 2924/15153* (2013.01); *H01L 2924/15311* (2013.01); *H01L 2924/186* (2013.01); *H01L 2924/18162* (2013.01); *H01L 2924/19041* (2013.01); *H01L 2924/19042* (2013.01); *H01L 2924/19105* (2013.01); *H01L 2924/3025* (2013.01); *H01L 2924/351* (2013.01); *H01L 2924/3511* (2013.01)
(58) Field of Classification Search
  USPC ................ 257/773, 777, 778, 790
  See application file for complete search history.

(56) References Cited

U.S. PATENT DOCUMENTS

| | | |
|---|---|---|
| 2009/0051038 A1 | 2/2009 | Jobetto |
| 2009/0244865 A1 | 10/2009 | Tanaka |
| 2012/0013021 A1 | 1/2012 | Kobayashi et al. |
| 2012/0133052 A1 | 5/2012 | Kikuchi et al. |
| 2013/0082369 A1 | 4/2013 | Kokubo |
| 2013/0119562 A1 | 5/2013 | Shimizu et al. |
| 2013/0269989 A1 | 10/2013 | Kim |
| 2014/0063768 A1* | 3/2014 | Tanaka ............... H01L 23/3121 361/784 |
| 2014/0103527 A1 | 4/2014 | Marimuthu et al. |
| 2014/0182895 A1 | 7/2014 | Lee et al. |
| 2014/0252641 A1* | 9/2014 | Lim .................... H01L 23/3128 257/773 |
| 2015/0171006 A1* | 6/2015 | Hung ................. H01L 23/5226 257/774 |
| 2015/0200166 A1* | 7/2015 | Kono ..................... H01L 24/03 257/529 |
| 2015/0255361 A1* | 9/2015 | Lee ..................... H01L 23/3135 257/738 |
| 2016/0013148 A1* | 1/2016 | Lin ....................... H01L 23/552 257/773 |

FOREIGN PATENT DOCUMENTS

| | | |
|---|---|---|
| CN | 103373027 A | 10/2013 |
| CN | 104582252 A | 4/2015 |
| JP | 2007-059821 A | 3/2007 |
| JP | 2012-021137 A | 2/2012 |
| JP | 2012-039090 A | 2/2012 |
| JP | 2013-089745 A | 5/2013 |
| JP | 2013-105840 A | 5/2013 |
| JP | 2014-027172 A | 2/2014 |
| JP | 2014-131040 A | 7/2014 |
| JP | 2015-207676 A | 11/2015 |
| KR | 10-2015-0099995 A | 9/2015 |
| WO | 2009/118950 A1 | 10/2009 |
| WO | 2011/016555 A1 | 10/2011 |
| WO | 2012/133839 A1 | 10/2012 |

OTHER PUBLICATIONS

Office Action issued in corresponding Japanese Patent Application No. 2017-039309, dated Jun. 26, 2018.
Japanese Office Action dated Oct. 16, 2018 issued in Japanese Patent Application No. 2017-039309 (with English translation).
Chinese Office Action dated Dec. 3, 2018 issued in Chinese Patent Application No. 201710181440.5 (with English translation).
Korean Office Action dated Nov. 20, 2018 issued in Korean Patent Application No. 10-2016-0107713 (with English translation).

* cited by examiner

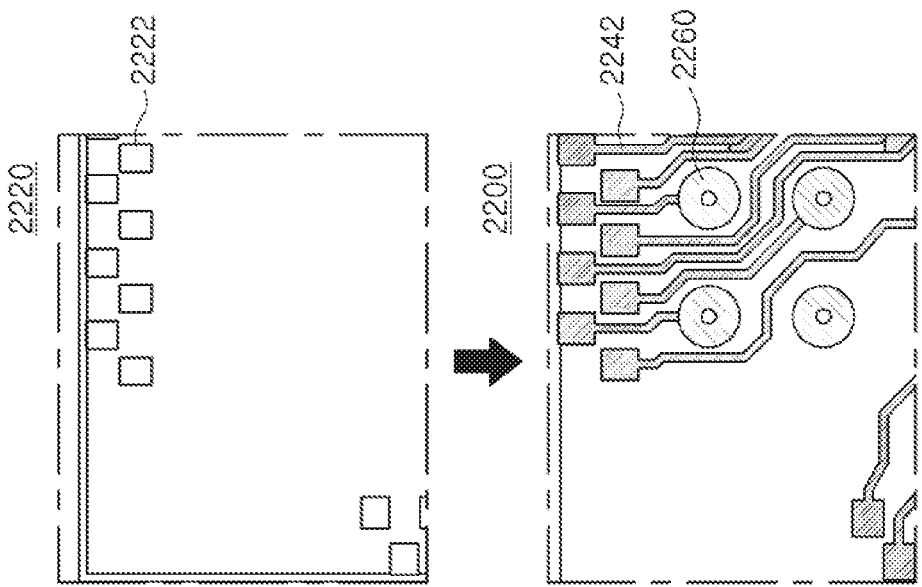
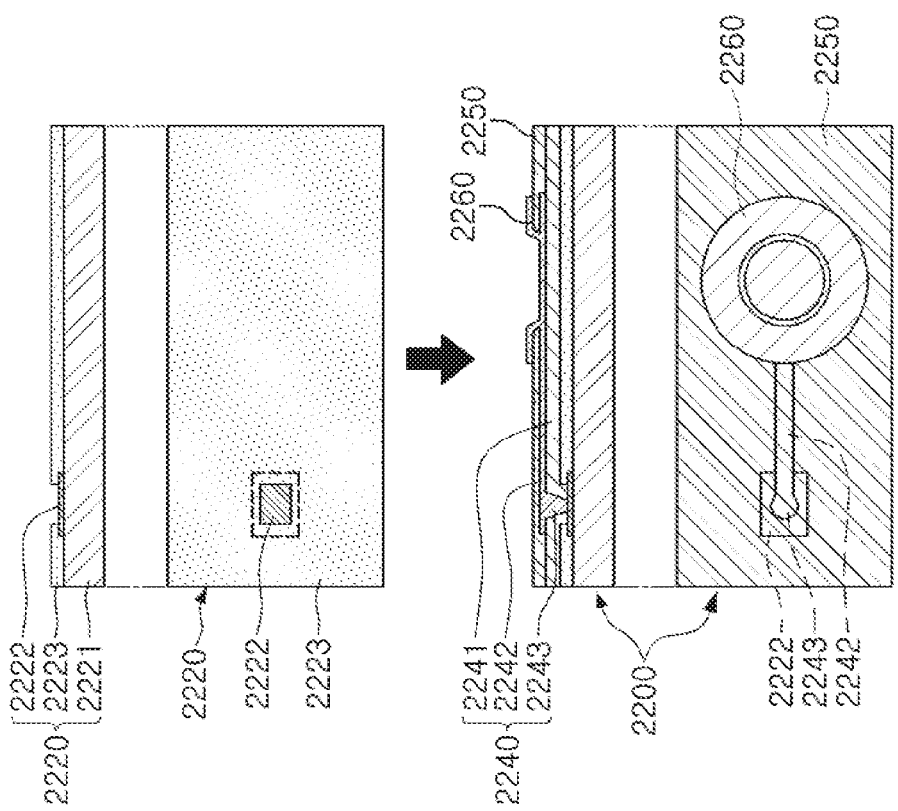
FIG. 3B
FIG. 3A

I - I'

FAN-OUT SEMICONDUCTOR PACKAGE

CROSS-REFERENCE TO RELATED APPLICATION(S)

This application claims benefit of priority to Korean Patent Application Nos. 10-2016-0036258 filed on Mar. 25, 2016, 10-2016-0083565 filed on Jul. 1, 2016 and 10-2016-0107713 filed on Aug. 24, 2016 in the Korean Intellectual Property Office, the disclosure of which is incorporated herein by reference in its entirety.

TECHNICAL FIELD

The present disclosure relates to a semiconductor package, and more particularly, to a fan-out semiconductor package in which connection terminals may extend outwardly of a region in which a semiconductor chip is disposed.

BACKGROUND

A significant recent trend in the development of technology related to semiconductor chips has been to reduce the size of semiconductor chips. Therefore, in the case of package technology, in accordance with a rapid increase in demand for small-sized semiconductor chips, or the like, the implementation of a semiconductor package having a compact size while including a plurality of pins has been demanded.

One type of package technology suggested to satisfy the technical demand described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package in which a warpage problem may be effectively solved.

According to an aspect of the present disclosure, a fan-out semiconductor package may be provided, in which a reinforcing layer that may control warpage of the fan-out semiconductor package is attached to an encapsulant encapsulating a semiconductor chip.

According to an aspect of the present disclosure, a fan-out semiconductor package may include: a first interconnection member having a through-hole; a semiconductor chip disposed in the through-hole of the first interconnection member and having an active surface having connection pads disposed thereon and an inactive surface opposing the active surface; an encapsulant encapsulating at least portions of the first interconnection member and the inactive surface of the semiconductor chip; a second interconnection member disposed on the first interconnection member and the active surface of the semiconductor chip; and a reinforcing layer disposed on the encapsulant. The first interconnection member and the second interconnection member respectively include redistribution layers electrically connected to the connection pads of the semiconductor chip.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Figure 1:
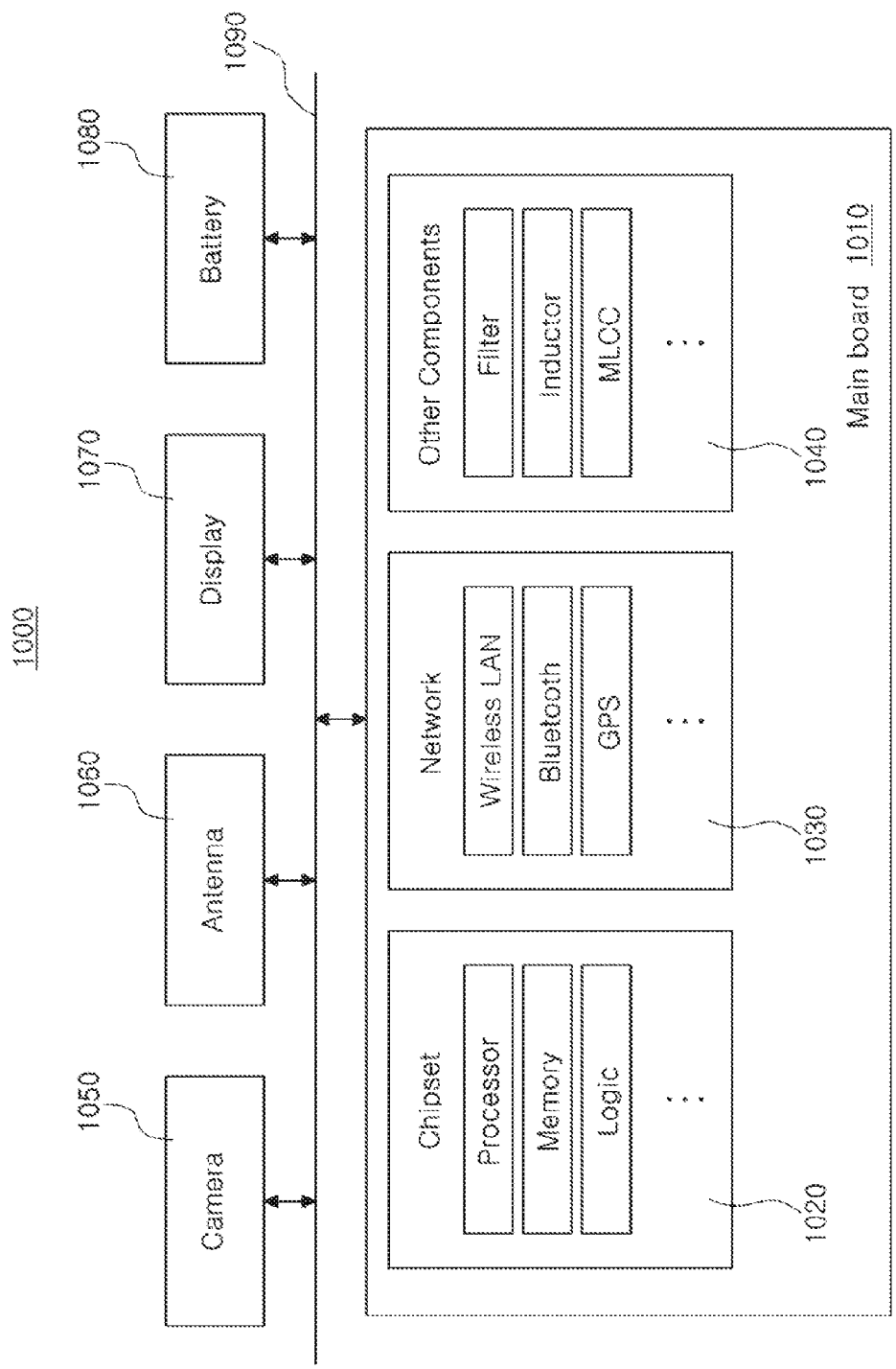
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or omitted for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the attached drawings. For example, a first interconnection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a main board 1010 therein. The main board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, and may also include other types of chip-related components. In addition, the chip-related components 1020 may be combined with each other.

The network-related components 1030 may be compatible with protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
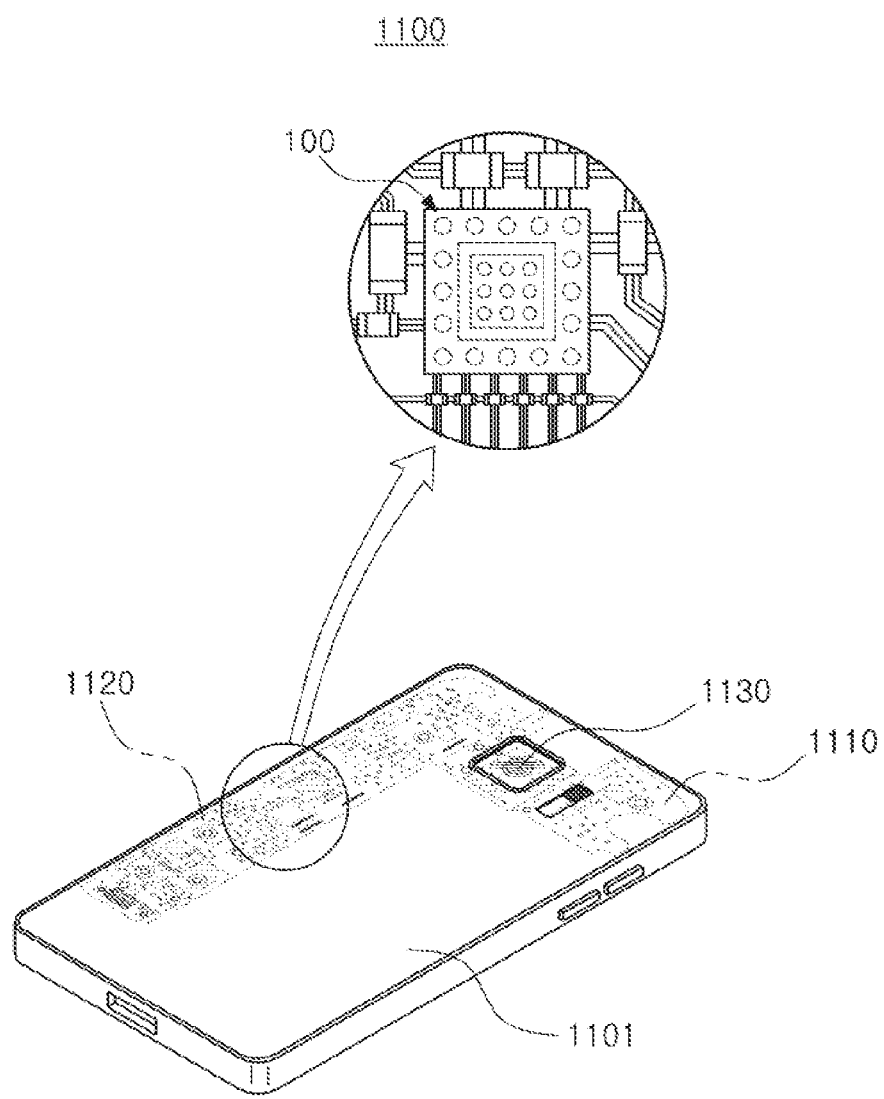
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip-related components, and the semiconductor package 100 may be, for example, an application processor among the chip-related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and intervals between the connection pads of the semiconductor chip are very fine, while sizes of component mounting pads of the main board used in the electronic device and intervals between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are schematic cross-sectional views illustrating states of a fan-in semiconductor package before and after being packaged.

Figure 4:
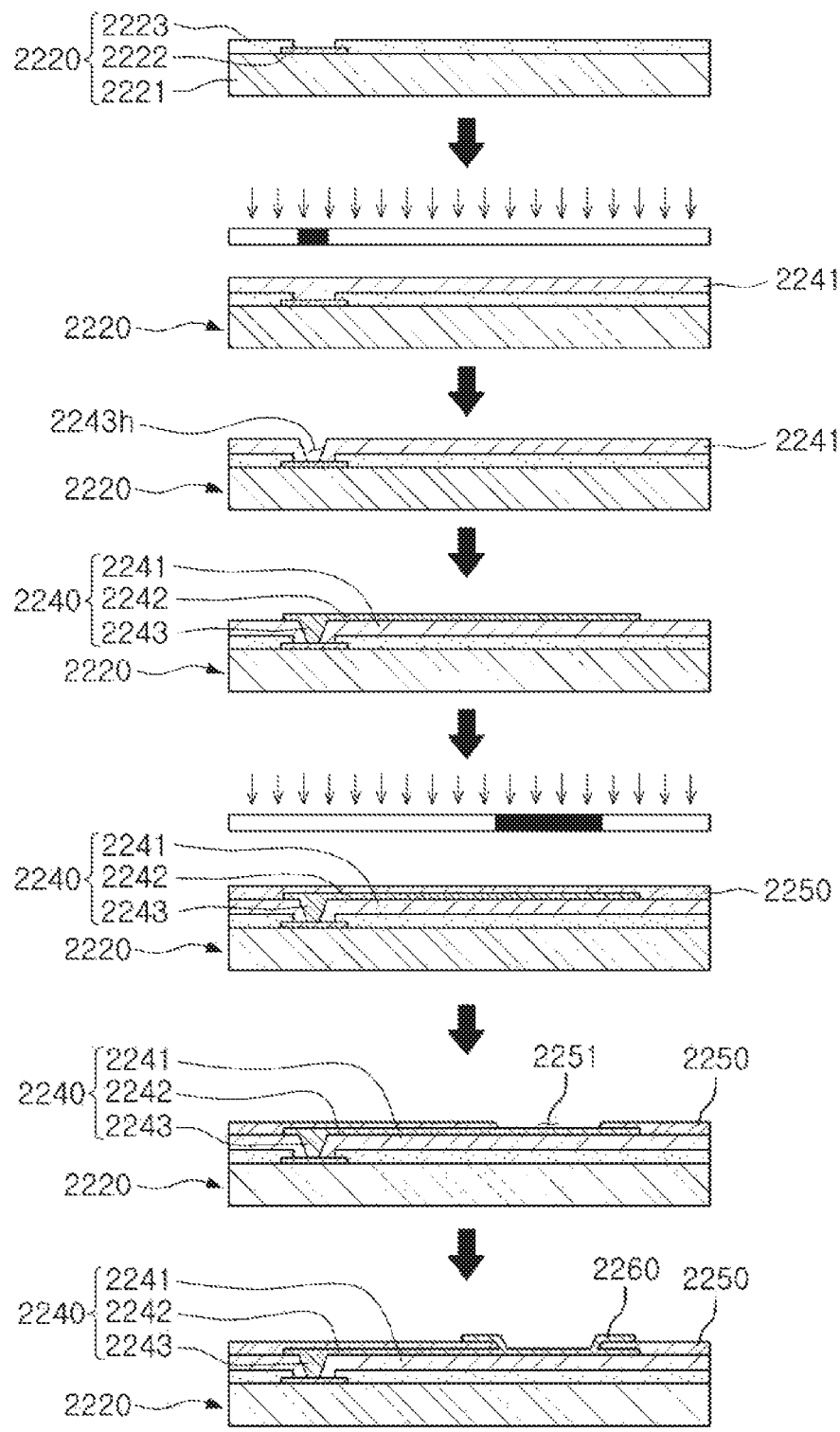
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a interconnection member 2240 may be formed on the semiconductor chip 2220 depending on a size thereof in order to redistribute the connection pads 2222. The interconnection member 2240 may be formed by forming an insulating layer 2241 on the semiconductor chip 2220 using an insulating material such as photoimagable dielectric (PID) resin, forming via holes 2243*h* opening the connection pads 2222, and then forming a redistribution layer 2242 and vias 2243. Then, a passivation layer 2250 protecting the interconnection member 2240 may be formed, an opening 2251 may be formed, and an under-bump metal layer 2260, or the like, may be formed. That is, a fan-in semiconductor package 2200 including, for example, the semiconductor chip 2220, the interconnection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, may have excellent electrical characteristics and may be produced at a low cost. Therefore, many elements mounted in smartphones have been manufactured in fan-in semiconductor package form. In detail, many elements mounted in smartphones have been developed to allow rapid signal transfer to be implemented while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
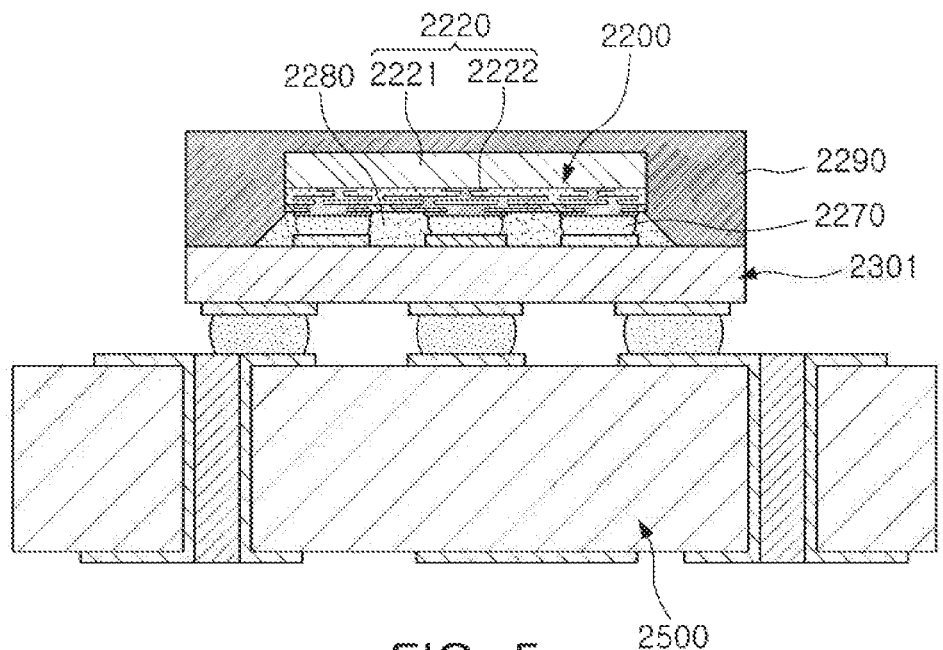
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
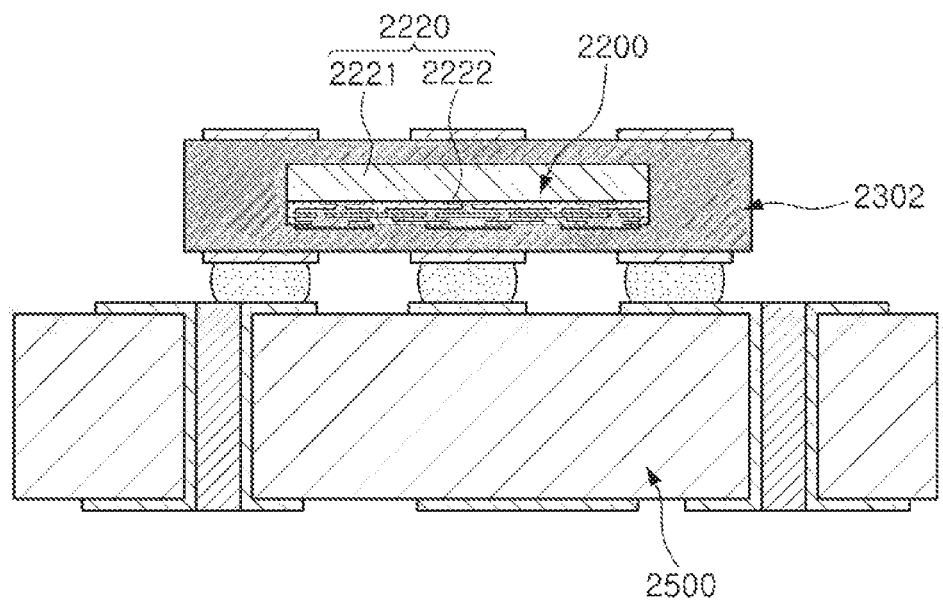
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in a state of being mounted on the interposer substrate 2301. In this case, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may again be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-out Semiconductor Package

Figure 7:
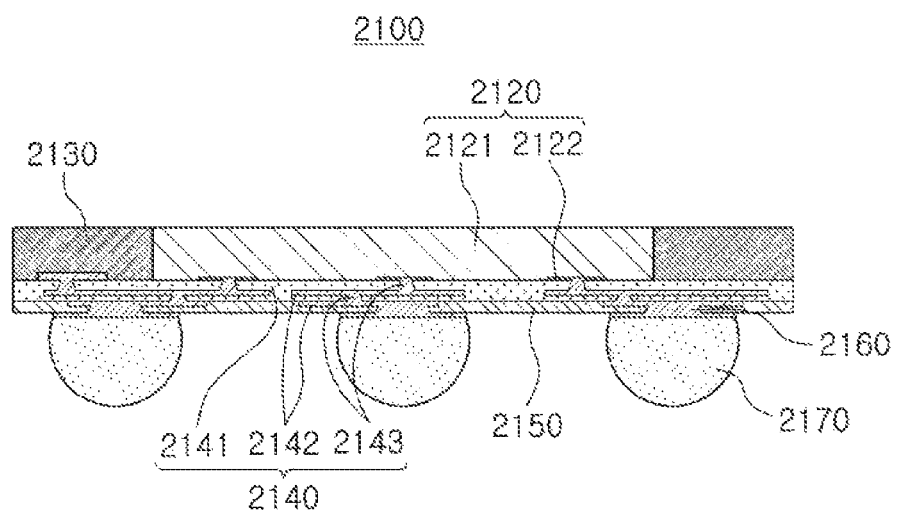
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a interconnection member 2140. In this case, a passivation layer 2150 may further be formed on the interconnection member 2140, and an under-bump metal layer 2160 may further be formed in openings of the passivation layer 2150. Solder balls 2170 may further be formed on the under-bump metal layer 2160. The semiconductor chip 2120 may be an integrated circuit (IC) including a body 2121, the connection pads 2122, a passivation layer (not illustrated), and the like. The interconnection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the interconnection member formed on the semiconductor chip. As described above, in the fan-in semiconductor package, all I/O terminals of the semiconductor chip need to be disposed inside the semiconductor chip. Therefore, when a size of the semiconductor chip is reduced, a size and a pitch of balls need to be reduced, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the interconnection member formed on the semiconductor chip as described above. Therefore, even in the case that a size of the semiconductor chip is reduced, a standardized ball layout may be used in the fan-out semiconductor package as it is, such that the fan-out semiconductor package may be mounted on the main board of the electronic device without using a separate interposer substrate, as described below.

Figure 8:
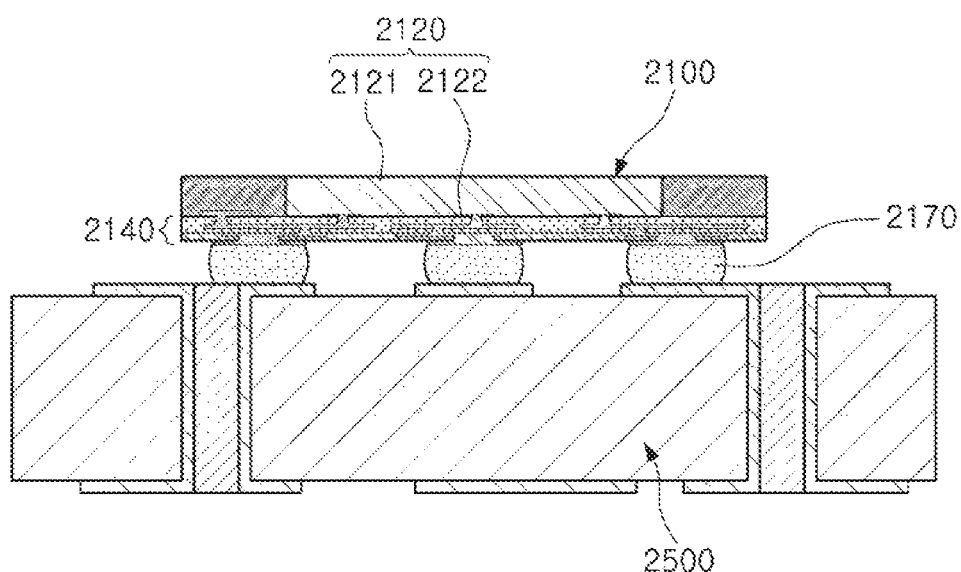
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the interconnection member 2140 formed on the semiconductor chip 2120 and capable of redistributing the connection pads 2122 to a fan-out region outside of an area of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type semiconductor package using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

A fan-out semiconductor package in which a warpage problem may be effectively solved will hereinafter be described with reference to the drawings.

Figure 9:
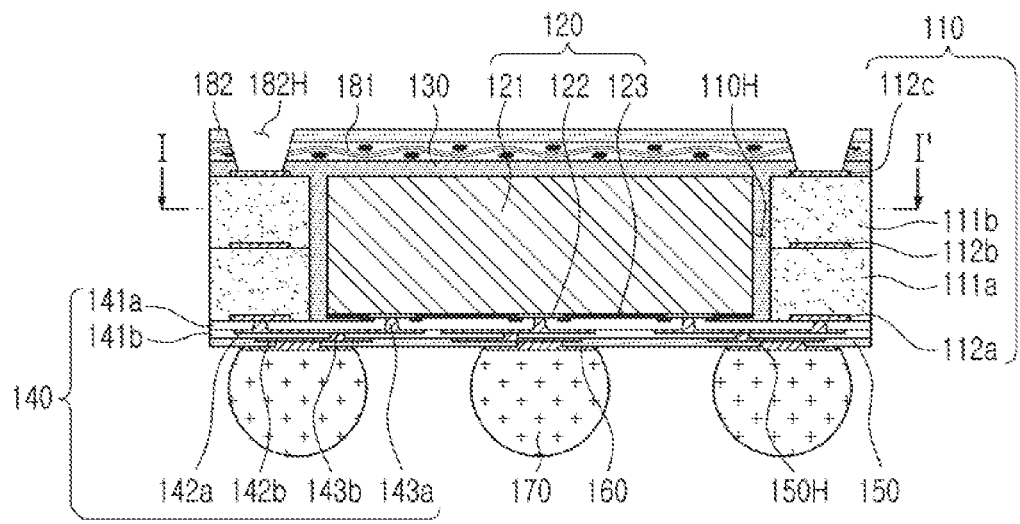
FIG. 9 is a schematic cross-sectional view illustrating an example of a fan-out semiconductor package.

FIG. 9 is a schematic cross-sectional view illustrating an example of a fan-out semiconductor package.

Figure 10:
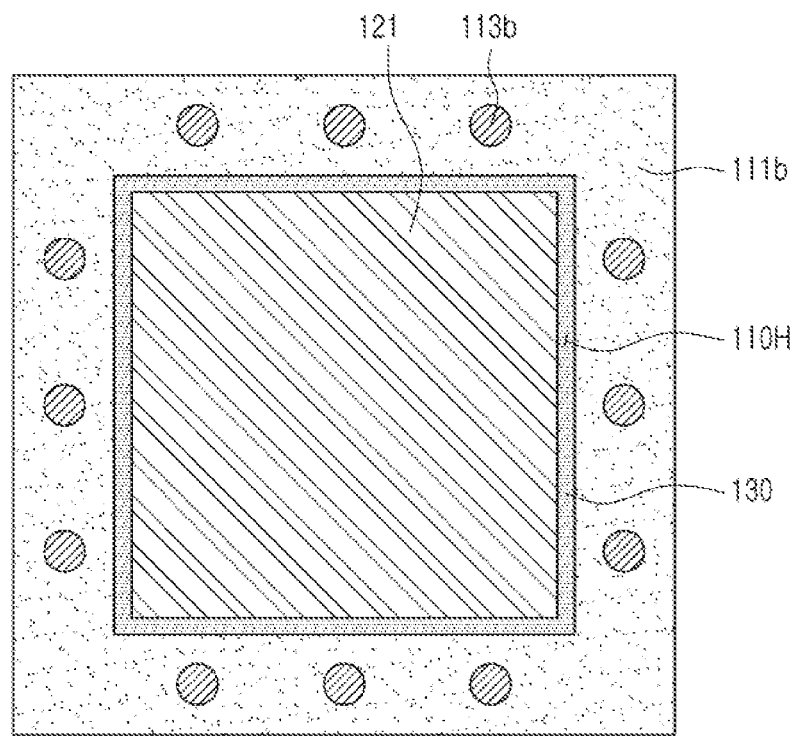
FIG. 10 is a schematic plan view taken along line I-I' of the fan-out semiconductor package of FIG. 9.
Figure 11A:
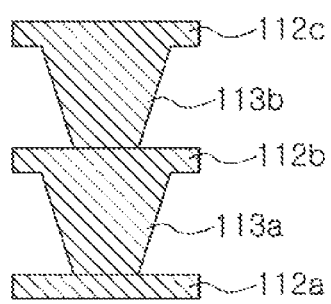
FIGS. 11A through 11D are schematic cross-sectional views illustrating various forms of vias formed in a first interconnection member of the fan-out semiconductor package of FIG. 9.
Figure 11B:
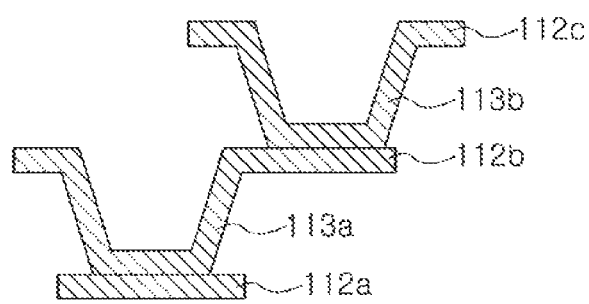
Figure 11C:
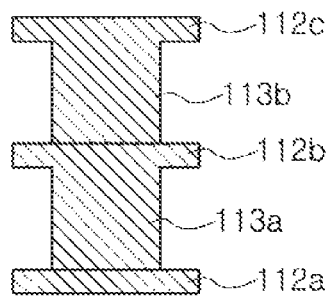
Figure 11D:
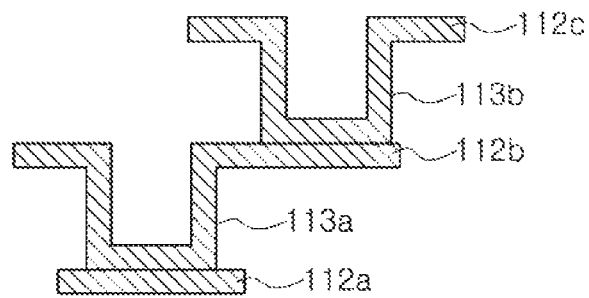

FIG. 10 is a schematic plan view taken along line I-I' of the fan-out semiconductor package of FIG. 9.

FIGS. 11A through 11D are schematic cross-sectional views illustrating various forms of vias formed in a first interconnection member of the fan-out semiconductor package of FIG. 9.

Referring to the drawings, a fan-out semiconductor package 100A according to an exemplary embodiment in the present disclosure may include a first interconnection member 110 having a through-hole 110H, a semiconductor chip 120 disposed in the through-hole 110H of the first interconnection member 110 and having an active surface having connection pads 122 disposed thereon and an inactive surface opposing the active surface, an encapsulant 130 encapsulating at least portions of the first interconnection member 110 and the inactive surface of the semiconductor chip 120, a second interconnection member 140 disposed on the first interconnection member 110 and the active surface of the semiconductor chip 120, a reinforcing layer 181 disposed on the encapsulant 130, a resin layer 182 disposed on the reinforcing layer 181, and openings 182H penetrating through the resin layer 182, the reinforcing layer 181, and the encapsulant 130 and exposing at least portions of a third redistribution layer 112c of the first interconnection member 110. The fan-out semiconductor package 100A according to the exemplary embodiment may further include a passivation layer 150 disposed on the second interconnection member 140, an under-bump metal layer 160 disposed in openings 150H of the passivation layer 150, and connection terminals 170 disposed on the under-bump metal layer 160. The reinforcing layer 181 may have an elastic modulus greater than that of the encapsulant 130, and may have a coefficient of thermal expansion (CTE) lower than that of the encapsulant 130.

Figure 26:
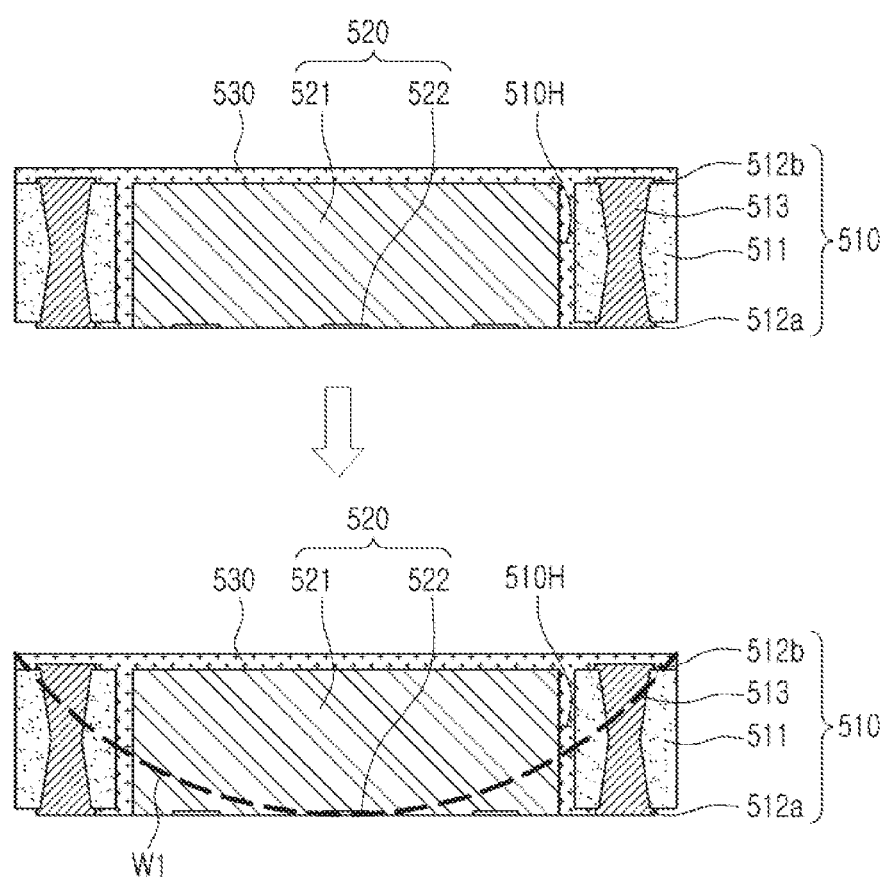
FIG. 26 is schematic views illustrating a case in which warpage is generated in a fan-out semiconductor package.

Meanwhile, as illustrated in FIG. 26, a thermosetting resin film that may firmly fix a first interconnection member 510, a semiconductor chip 520, and the like, may be used in order to form an encapsulant 530 encapsulating the first interconnection member 510, the semiconductor chip 520, and the like. In detail, the thermosetting resin film having a high CTE, generally having good resin flowability, may be used to form the encapsulant 530, in order to completely fill a space of a through-hole 510H between the first interconnection member 510 and the semiconductor chip 520 with a resin and increase close adhesion between the first interconnection member 510 and the semiconductor chip 520. However, in this thermosetting resin film, heat-hardening contraction of the resin is large, such that warpage W1 may be severely generated in a package after the resin is hardened. Therefore, it may be difficult to form fine circuit patterns on an active surface of the semiconductor chip 520 later.

Figure 27:
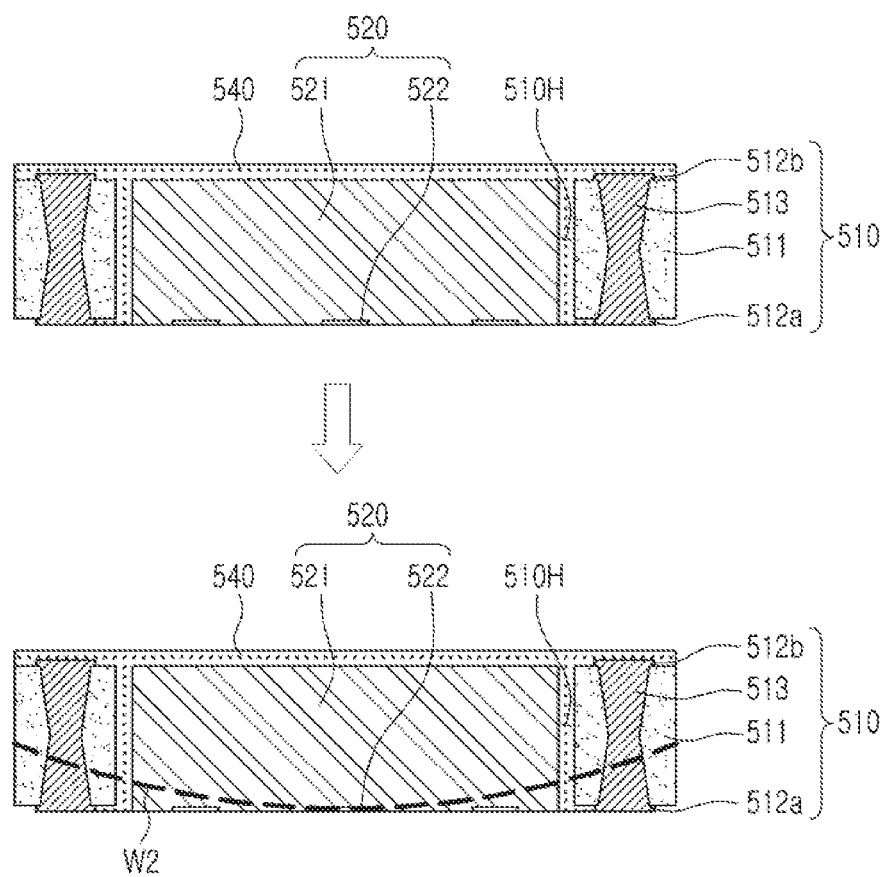
FIG. 27 is schematic views illustrating a case in which warpage of a fan-out semiconductor package is suppressed.
Figure 28:
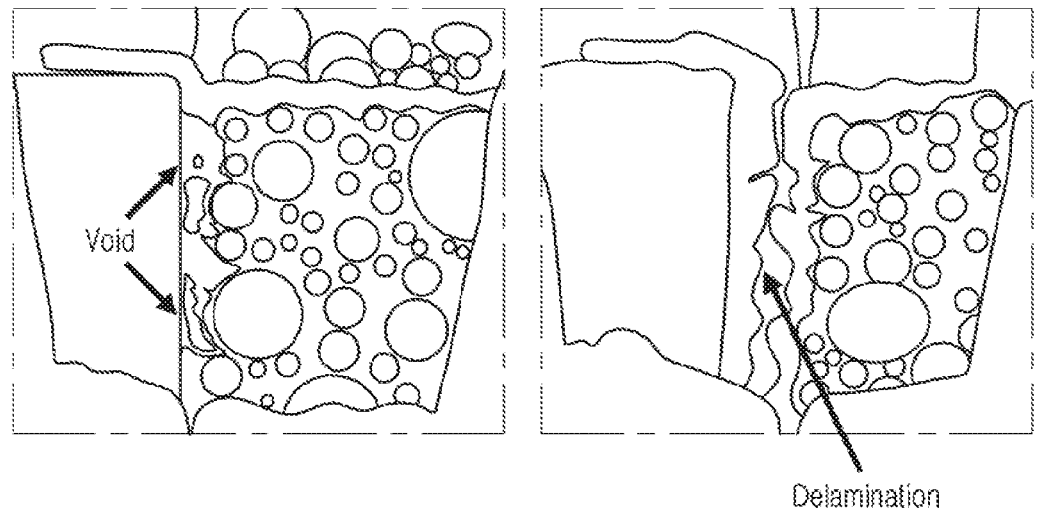
FIG. 28 is schematic views illustrating additional problems occurring in FIG. 27.

Meanwhile, as illustrated in FIG. 27, in order to solve this problem, it may be considered that a thermosetting resin film having a low CTE is used to form an encapsulant 540. In this case, warpage W2 may be suppressed as compared to in a case of using the thermosetting resin film having the high CTE. However, as illustrated in FIG. 28, a content of inorganic filler in the thermosetting resin film is generally increased in order to reduce a CTE, such that a resin may not sufficiently fill a fine space due to a reduction in resin flowability, leading to formation of a void, or the like. In addition, delamination between a first interconnection member and a semiconductor chip, or the like, may be generated due to a reduction in close adhesion between the first interconnection member and the semiconductor chip.

On the other hand, in a case in which the reinforcing layer 181 having a relatively large elastic modulus or a relatively small CTE is introduced as in the fan-out semiconductor package 100A according to the exemplary embodiment, the reinforcing layer 181 may suppress hardening contraction of a material of the encapsulant 130, such as the thermosetting resin film, such that generation of warpage of the fan-out semiconductor package 100A may be significantly reduced after the material is hardened. Therefore, a material having a high CTE may be used as a material of the encapsulant 130. Resultantly, a problem such as a void, delamination, or the like, may not occur.

Meanwhile, in the fan-out semiconductor package 100A according to the exemplary embodiment, the reinforcing layer 181 may include a glass cloth, an inorganic filler, and an insulating resin. In this case, it may not be easy to form openings in the reinforcing layer 181. However, in a case in which the resin layer 182 is disposed on the reinforcing layer 181, this problem may be solved. For example, in a case in which a material the same as or similar to that of the encapsulant 130, for example, an insulating material that includes an inorganic filler and an insulating resin, but does not include a core material such as a glass cloth (or a class fabric), or the like, that is, Ajinomoto Build-up Film (ABF), or the like, is used as a material of the resin layer 182, the openings 182H may be easily formed. Wirings exposed through the openings 182H may be used as markings, pads, or the like.

The respective components included in the fan-out semiconductor package 100A according to the exemplary embodiment will hereinafter be described in more detail.

The first interconnection member 110 may include redistribution layers 112a and 112b redistributing the connection pads 122 of the semiconductor chip 120 to thus reduce the number of layers of the second interconnection member 140. If necessary, the first interconnection member 110 may maintain rigidity of the fan-out semiconductor package 100A depending on materials of the encapsulant 130, and serve to secure uniformity of a thickness of the encapsulant 130. In some cases, due to the first interconnection member 110, the fan-out semiconductor package 100A according to the exemplary embodiment may be used as a portion of a package-on-package semiconductor package. The first interconnection member 110 may have the through-hole 110H. The through-hole 110H may have the semiconductor chip 120 disposed therein to be spaced apart from the first interconnection member 110 by a predetermined distance. Side surfaces of the semiconductor chip 120 may be surrounded by the first interconnection member 110. However, such a form is only an example and the present disclosure may be variously modified to have other forms, and the fan-out semiconductor package 100A may perform another function depending on such a form.

The first interconnection member 110 may include a first insulating layer 111a in contact with the second interconnection member 140, a first redistribution layer 112a in contact with the second interconnection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and the third redistribution layer 112c disposed on the second insulating layer 111b. The first to third redistribution layers 112a, 112b, and 112c may be electrically connected to the connection pads 122. The first interconnection member 110 may include first and second vias 113a and 113b penetrating through the first and second insulating layers 111a and 111b, respectively, and electrically connecting the first and second redistribution layers 112a and 112b and the second and third redistribution layers 112b and 112c to each other, respectively. Since the first redistribution layer 112a is embedded, an insulating distance of an insulating layer 141a of the second interconnection member 140 may be substantially constant, as described above. Since the first interconnection member 110 may include a large number of redistribution layers 112a, 112b, and 112c, the second interconnection member 140 may be further simplified. Therefore, a decrease in a yield depending on a defect occurring in a process of forming the second interconnection member 140 may be improved.

A case in which the first interconnection member 110 includes two insulating layers 111a and 111b is illustrated in the drawing, but the number of insulating layers constituting the first interconnection member 110 may be greater than two. In this case, the number of redistribution layers disposed in the first interconnection member 110 may be increased, and additional vias connecting the redistribution layers to each other may be formed.

A material of each of the insulating layers 111a and 111b is not particularly limited. For example, an insulating material may be used as a material of each of the insulating layer 111a and 111b. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass cloth (or a glass fabric), for example, prepreg, Ajinomoto Build up Film (ABF), FR-4, Bismaleimide Triazine (BT), or the like. Alternatively, a photoimagable dielectric (PID) resin may also be used as the insulating material. The first insulating layer 111a and the second insulating layer 111b may include the same insulating material, and a boundary between the first insulating layer 111a and the second insulating layer 111b may not be apparent. However, the first insulating layer 111a and the second insulating layer 111b are not limited thereto.

The redistribution layers 112a, 112b, and 112c may serve to redistribute the connection pads 122 of the semiconductor chip 120, and a material of each of the redistribution layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The redistribution layers 112a, 112b, and 112c may have various functions depending on designs of layers corresponding thereto. For example, the redistribution layers 112a, 112b, and 112c may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a, 112b, and 112c may include a via pad, a connection terminal pad, and the like. As a non-restrictive example, both of the redistribution layers 112a, 112b, and 112c may include a ground pattern. In this case, the number of ground patterns formed on the redistribution layers 142a and 142b of the second interconnection member 140 may be significantly reduced, such that a degree of wiring design freedom may be improved.

A surface treatment layer (not illustrated) may further be formed on the third redistribution layer 112c exposed from the redistribution layers 112a, 112b, and 112c through the openings 182H, if necessary. The surface treatment layer (not illustrated) is not particularly limited as long as it is known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The vias 113a and 113b may electrically connect the redistribution layers 112a, 112b, and 112c formed on different layers to each other, resulting in an electrical path in the first interconnection member 110. A material of each of the vias 113a and 113b may be a conductive material. As illustrated in FIGS. 11A through 11D, each of the vias 113 may be entirely filled with the conductive material or the conductive material may also be formed along a wall of respective via holes. In addition, each of the vias 113a and 113b may have all shapes known in the related art, such as a tapered shape, a cylindrical shape, and the like. Meanwhile, as can be seen from a process to be described below, some of pads of the first redistribution layer 112a may serve as a stopper when holes for the first vias 113a are formed, and some of pads of the second redistribution layer 112b may serve as a stopper when holes for the second vias 113b are formed, and it may thus be advantageous in a process that each of the first and second vias 113a and 113b has the tapered shape of which a width of an upper surface is greater than that of a lower surface. In this case, the first vias 113a may be integrated with portions of the second redistribution layer 112b, and the second vias 113b may be integrated with portions of the third redistribution layer 112c.

The semiconductor chip 120 may be an integrated circuit (IC) provided in an amount of several hundreds to several millions of elements or more integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto. The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of the connection pads 122 may be a conductive material such as aluminum (Al), or the like. A passivation layer 123 exposing the connection pads 122 may be formed on the body 121, and may be an oxide film, a nitride film, or the like, or a double layer formed of an oxide layer and a nitride layer. A lower surface of the connection pads 122 may have a step portion with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions.

The inactive surface of the semiconductor chip 120 may be disposed on a level below an upper surface of the third redistribution layer 112c of the first interconnection member 110. For example, the inactive surface of the semiconductor chip 120 may be disposed on a level below an upper surface of the second insulating layer 111b of the first interconnection member 110. A height difference between the inactive surface of the semiconductor chip 120 and the upper surface of the third redistribution layer 112c of the first interconnection member 110 may be 2 μm or more, for example, 5 μm or more. In this case, the generation of cracks in corners of the inactive surface of the semiconductor chip 120 may be effectively prevented. In addition, a deviation of an insulating distance on the inactive surface of the semiconductor chip 120 in a case in which the encapsulant 130 is used may be significantly reduced.

The second redistribution layer 112b of the first interconnection member 110 may be disposed on a level between the active surface and the inactive surface of the semiconductor chip 120. The first interconnection member 110 may be formed to a thickness corresponding to that of the semiconductor chip 120. Therefore, the second redistribution layer 112b formed in the first interconnection member 110 may be disposed on the level between the active surface and the inactive surface of the semiconductor chip 120.

The encapsulant 130 may protect the first interconnection member 110 and/or the semiconductor chip 120. An encapsulation form of the encapsulant 130 is not particularly limited, but may be a form in which the encapsulant 130 surrounds at least portions of the first interconnection member 110 and/or the semiconductor chip 120. For example, the encapsulant 130 may cover the first interconnection member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second interconnection member 140. Meanwhile, the encapsulant 130 may fill the through-hole 110H to thus serve as an adhesive and reduce buckling of the semiconductor chip 120 depending on materials of the encapsulant 130.

The materials of the encapsulant 130 are not particularly limited. For example, an insulating material may be used as the materials of the encapsulant 130. In this case, the insulating material may be a thermosetting resin such as an epoxy resin, a thermoplastic resin such as a polyimide resin, a resin having a reinforcing material such as an inorganic filler impregnated in the thermosetting resin and the thermoplastic resin, for example, ABF, FR-4, BT, a PID resin, or the like. In addition, a known molding material such as an epoxy molding compound (EMC), or the like, may also be used. Alternatively, a resin in which a thermosetting resin or a thermoplastic resin is impregnated together with an inorganic filler in a core material such as a glass cloth (or a glass fabric) may also be used as the insulating material.

The encapsulant 130 may include a plurality of layers formed of a plurality of materials. For example, a space within the through-hole 110H may be filled with a first encapsulant, and the first interconnection member 110 and the semiconductor chip 120 may be covered with a second encapsulant. Alternatively, the first encapsulant may cover the first interconnection member 110 and the semiconductor chip 120 at a predetermined thickness while filling the space within the through-hole 110H, and the second encapsulant may cover the first encapsulant at a predetermined thickness. In addition to the form described above, various forms may be used.

The encapsulant 130 may include conductive particles in order to block electromagnetic waves, if necessary. For example, the conductive particles may be any material that may block electromagnetic waves, for example, copper (Cu), aluminum (Al), silver (Ag), tin (Sn), gold (Au), nickel (Ni), lead (Pb), titanium (Ti), a solder, or the like. However, this is only an example, and the conductive particles are not limited thereto.

The second interconnection member 140 may be configured to redistribute the connection pads 122 of the semiconductor chip 120. Several tens to several hundreds of connection pads 122 having various functions may be redistributed by the second interconnection member 140, and may be physically or electrically connected to an external source through connection terminals 170 to be described below depending on the functions. The second interconnection member 140 may include insulating layers 141a and 141b, the redistribution layers 142a and 142b disposed on the insulating layers 141a and 141b, and vias 143a and 143b penetrating through the insulating layers 141a and 141b and connecting the redistribution layers 142a and 142b to each other. In the fan-out semiconductor package 100A according to the exemplary embodiment, the second interconnection member 140 may include a plurality of redistribution layers 142a and 142b, but is not limited thereto. That is, the second interconnection member 140 may also include a single layer. In addition, the second interconnection member 140 may also include different numbers of layers.

An insulating material may be used as a material of each of the insulating layers 141a and 141b. In this case, a photosensitive insulating material such as a photoimagable dielectric (PID) resin may also be used as the insulating material. In this case, each of the insulating layers 141a and 141b may be formed to have a smaller thickness, and a fine pitch of each of the vias 143a and 143b may be achieved more easily. Materials of the insulating layers 141a and 141b may be the same as each other or may be different from each other, if necessary. The insulating layers 141a and 141b may be integrated with each other depending on processes, so that a boundary therebetween may not be readily apparent.

The redistribution layers 142a and 142b may serve to substantially redistribute the connection pads 122. A material of each of the redistribution layers 142a and 142b may be a conductive material such as copper (Cu), aluminum (Al), silver (Ag), tin (Sn), gold (Au), nickel (Ni), lead (Pb), titanium (Ti), or alloys thereof. The redistribution layers 142a and 142b may have various functions depending on designs of layers corresponding thereto. For example, the redistribution layers 142a and 142b may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 142a and 142b may include a via pad, a connection terminal pad, and the like.

A surface treatment layer (not illustrated) may further be formed on portions of the redistribution layer 142b exposed from the redistribution layers 142a and 142b, if necessary. The surface treatment layer (not illustrated) is not particularly limited as long as it is known in the related art, and may be formed by, for example, electrolytic gold plating, electroless gold plating, OSP or electroless tin plating, electroless silver plating, electroless nickel plating/substituted gold plating, DIG plating, HASL, or the like.

The vias 143a and 143b may electrically connect the redistribution layers 142a and 142b, the connection pads 122, or the like, formed on different layers, to each other, resulting in an electrical path in the fan-out semiconductor package 100A. A material of each of the vias 143a and 143b may be a conductive material such as copper (Cu), aluminum (Al), silver (Ag), tin (Sn), gold (Au), nickel (Ni), lead (Pb), titanium (Ti), or alloys thereof. Each of the vias 143a and 143b may be entirely filled with the conductive material, or the conductive material may also be formed along a wall of each of the vias. In addition, each of the vias 143a and 143b may have all shapes known in the related art, such as a tapered shape, a cylindrical shape, and the like.

Thicknesses of the redistribution layers 112a, 112b, and 112c of the first interconnection member 110 may be greater than those of the redistribution layers 142a and 142b of the second interconnection member 140. Since the first interconnection member 110 may have a thickness equal to or greater than that of the semiconductor chip 120, the redistribution layers 112a, 112b, and 112c formed in the first interconnection member 110 may be formed to be large depending on a scale of the first interconnection member 110. On the other hand, the redistribution layers 142a and 142b of the second interconnection member 140 may be formed to have sizes relatively smaller than those of the redistribution layers 112a, 112b, and 112c of the first interconnection member 110 for thinness of the second interconnection member 140.

The reinforcing layer 181 may suppress warpage generated in the fan-out semiconductor package 100A. For example, the reinforcing layer 181 may suppress the hardening contraction of the material of the encapsulant 130, such as the thermosetting resin film to suppress warpage of the fan-out semiconductor package 100A. The reinforcing layer 181 may have an elastic modulus relatively greater than that of the encapsulant 130, and may have a CTE smaller than that of the encapsulant 130. In this case, a warpage suppression effect may be particularly excellent.

The reinforcing layer 181 may include a core material, an inorganic filler, and an insulating resin. For example, the reinforcing layer 181 may be formed of an unclad copper clad laminate (CCL), prepreg, or the like. In a case in which the reinforcing layer 181 includes the core material such as a glass cloth (or a glass fabric), the reinforce layer 181 may be implemented to have a relatively large elastic modulus, and in case in which the reinforcing layer 181 includes the inorganic filler, the reinforce layer 181 may be implemented to have a relatively small CTE by adjusting a content of the inorganic filler. The reinforcing layer 181 may be attached in a hardened state (a c-stage) to the encapsulant 130. In this case, a boundary surface between the encapsulant 130 and the reinforcing layer 181 may have an approximately linear shape. Meanwhile, the inorganic filler may be silica, alumina, or the like, and the resin may be an epoxy resin, or the like. However, the inorganic filler and the resin are not limited thereto.

The resin layer 182 may be disposed on the reinforcing layer 181. The resin layer 182 may be formed of a material the same as or similar to that of the encapsulant 130, for example, an insulating material that includes an inorganic filler and an insulating resin, but does not include a core material, that is, Ajinomoto Build-up Film (ABF), or the like. In a case in which the reinforcing layer 181 includes the core material, or the like, it is difficult to form the openings 182H in the reinforcing layer 181 itself, but in a case in which the resin layer 182 is added, the openings 182H may be easily formed. The openings 182H may penetrate through the encapsulant 130, the reinforcing layer 181, and the resin layer 182, and may expose at least portions of the third redistribution layer 112c of the first interconnection member 110. The openings 182H may be utilized as openings for marking. Alternatively, the openings 182H may be utilized as openings for exposing pads in a package-on-package structure. Alternatively, the openings 182H may be utilized as openings for mounting a surface mounted technology (SMT) component. In a case in which the resin layer 182 is disposed, the warpage may be more easily suppressed.

The passivation layer 150 may be additionally configured to protect the second interconnection member 140 from external physical or chemical damage. The passivation layer 150 may have the openings 150H exposing at least portions of one 142b of redistribution layers 142a and 142b of the second interconnection member 140. The openings 150H may expose the entirety or only a portion of a surface of the redistribution layer 142b. A material of the passivation layer 150 is not particularly limited, but may be a photosensitive insulating material such as a PID resin. Alternatively, a solder resist may also be used as a material of the passivation layer 150. Alternatively, an insulating resin that does not include a core material, but includes a filler, for example, ABF including an inorganic filler and an epoxy resin, may be used as the material of the passivation layer 150. In a case in which an insulating material that includes an inorganic filler and an insulating resin, but does not include a core material, for example, the ABF, or the like, is used as the material of the passivation layer 150, the passivation layer 150 and the resin layer 182 may have a symmetrical effect to each other, which may be more effective in controlling the warpage.

When the insulating material including the inorganic filler and the insulating resin, for example, the ABF, or the like, is used as the material of the passivation layer 150, the insulating layers 141a and 141b of the second interconnection member 140 may also include an inorganic filler and an insulating resin. In this case, a weight percentage of inorganic filler included in the passivation layer 150 may be greater than that of an inorganic filler included in the insulating layers 141a and 141b of the second interconnection member 140. In this case, the passivation layer 150 may have a relatively low CTE, and may be utilized to control the warpage, similar to the reinforcing layer 181.

The passivation layer 150 may be formed of a material satisfying Equations 1 to 4, if necessary. In this case, board level reliability of the electronic component package may be improved. An elastic modulus is defined as a ratio between stress and deformation, and may be measured through a standard tension test specified in, for example, JIS C-6481, KS M 3001, KS M 527-3, ASTM D882, and the like. In addition, a CTE may refer to a CTE measured using a thermomechanical analyzer (TMA) or a dynamic mechanical analyzer (DMA). In addition, a thickness refers to a thickness of the passivation layer 150 after being hardened, and may be measured using a general thickness measuring apparatus. In addition, a surface roughness may be formed by a known method such as a surface treatment using cubic zirconia (CZ), and may be measured using a general roughness measuring apparatus. In addition, a moisture absorption ratio may be measured using a general measuring apparatus.

$$\text{Elastic Modulus} \times \text{Coefficient of Thermal Expansion} = 230 \text{ GPa·ppm/}^\circ \text{C.} \qquad \text{Equation 1:}$$

$$\text{Thickness} = 10 \text{ μm} \qquad \text{Equation 2:}$$

$$\text{Surface Roughness} = 1 \text{ nm} \qquad \text{Equation 3:}$$

$$\text{Moisture Absorption Ratio} = 1.5\% \qquad \text{Equation 4:}$$

The under-bump metal layer 160 may be additionally configured to improve connection reliability of the connection terminals 170 to improve board level reliability of the fan-out sensor package 100A. The under-bump metal layer 160 may be disposed on walls in the openings 150H of the passivation layer 150 and the exposed redistribution layer 142b of the second interconnection member 140. The under-bump metal layer 160 may be formed by a known metallization method using a known conductive material such as a metal.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto. The number, interval, disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less.

At least one of the connection terminals 170 may be disposed in a fan-out region. The fan-out region is a region except for the region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a reduced thickness, and may have price competitiveness.

If necessary, a plurality of semiconductor chips (not illustrated) may be disposed in the through-hole 110H of the first interconnection member 110, and the number of through-holes 110H of the first interconnection member 110 may be plural (not illustrated) and semiconductor chips (not illustrated) may be disposed in the through-holes, respectively. In addition, separate passive components (not illustrated) such as a condenser, an inductor, and the like, may be encapsulated, together with the semiconductor chip, in the through-hole 110H. In addition, a surface mounted technology component (not illustrated) may be mounted on the passivation layer 150.

FIGS. 12 through 16 are schematic views illustrating an example of processes of manufacturing the fan-out semiconductor package of FIG. 9.

Figure 12:
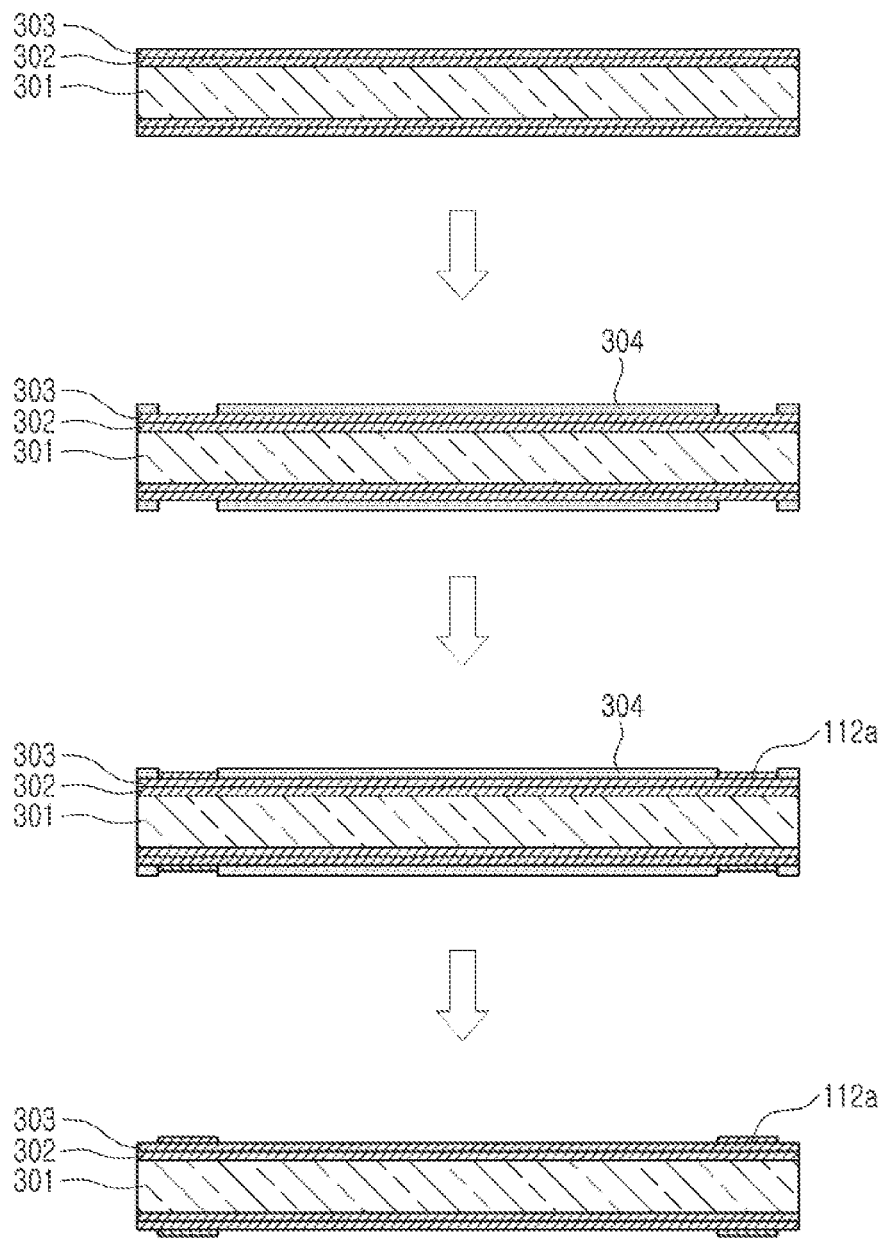
FIGS. 12 through 16 are schematic views illustrating an example of processes of manufacturing the fan-out semiconductor package of FIG. 9.

Referring to FIG. 12, a carrier film 301 may first be prepared. The carrier film 301 may have metal layers 302 and 303 formed on one surface or opposite surfaces thereof. A surface treatment may be performed on a bonded surface between the metal layers 302 and 303 in order to facilitate separation in the subsequent separating process. Alternatively, a release layer may be provided between the metal layers 302 and 303 to facilitate separation in the subsequent process. The carrier film 301 may be a known insulating substrate, and a material of the carrier film 301 is not particularly limited. The metal layers 302 and 303 may be generally copper (Cu) foil, but are not limited thereto. That is, the metal layers 302 and 303 may be thin films formed of other conductive materials. Then, patterning for forming the first redistribution layer 112a may be performed using a dry film 304. The first redistribution layer 112a may be formed using a known photolithography method. The dry film 304 may be a known dry film formed of a photosensitive material. Then, a conductive material may be disposed in a patterned space of the dry film 304 to form the first redistribution layer 112a. The first redistribution layer 112a may be formed using a plating process. In this case, the metal layer 303 may serve as a seed layer. The plating process may be electroplating or electroless plating, more specifically, chemical vapor deposition (CVD), physical vapor deposition (PVD), sputtering, a subtractive process, an additive process, a semi-additive process (SAP), a modified semi-additive process (MSAP), or the like, but is not limited thereto. Then, the dry film 304 may be removed. The dry film 304 may be removed by a known method such as an etching process, or the like.

Figure 13:
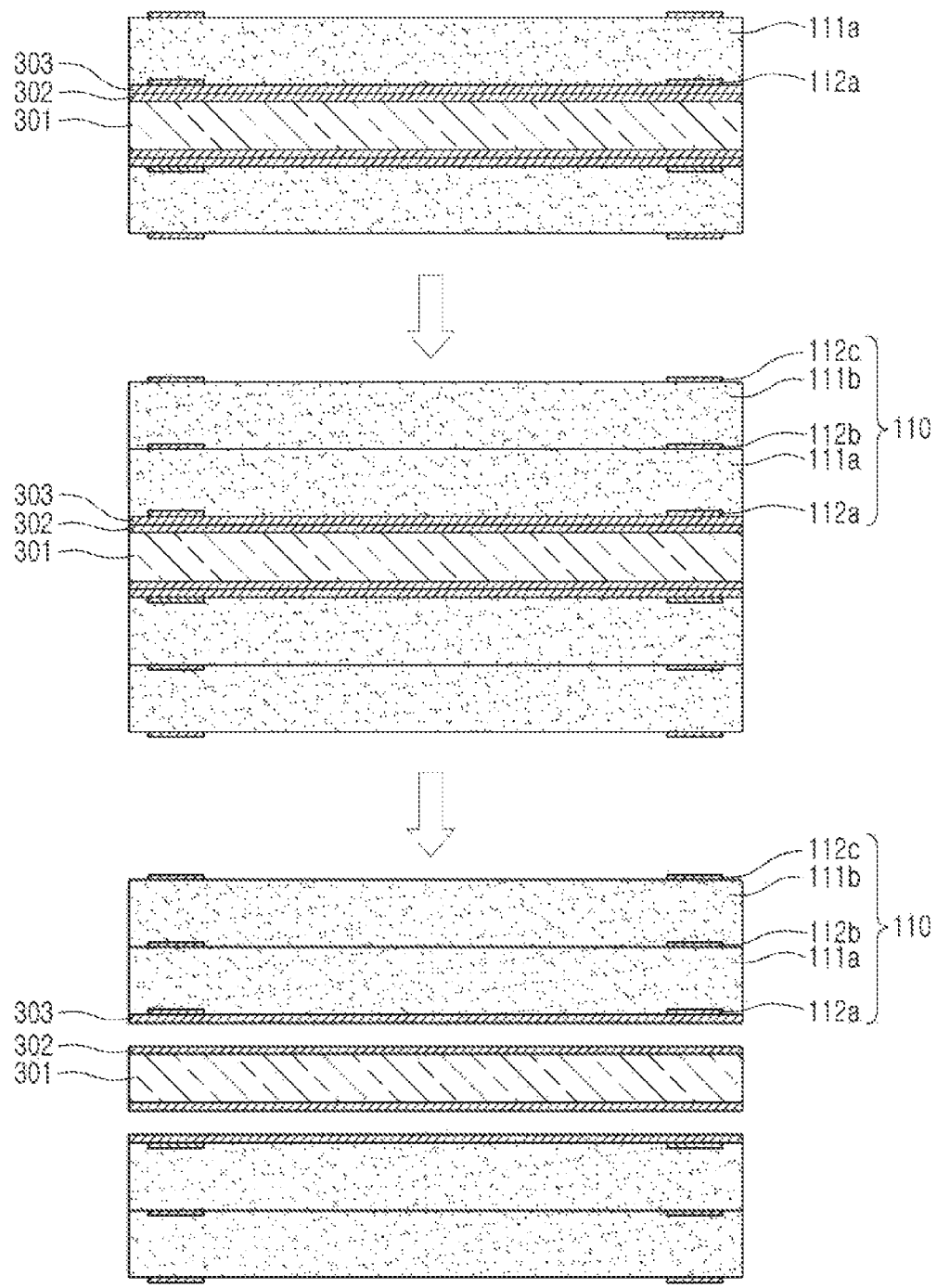

Referring to FIG. 13, then, the first insulating layer 111a embedding at least a portion of the first redistribution layer 112a therein may be formed on the metal layer 303. Then, the first vias 113a penetrating through the first insulating layer 111a may be formed. In addition, the second redistribution layer 112b may be formed on the first insulating layer 111a. The first insulating layer 111a may be formed by a method of laminating a precursor of the first insulating layer 111a by a known lamination method and then hardening the precursor, a method of applying a precursor of the first insulating layer 111a using a known applying method and then hardening the precursor, or the like. The first vias 113a and the second redistribution layer 112b may be formed by a method of forming via holes in the first insulating layers 111a using a photolithography method, mechanical drilling, laser drilling, or the like, performing patterning using a dry film, or the like, and filling the via holes and the patterned space by a plating process, or the like. Then, the second insulating layer 111b covering the second redistribution layer 112b may be formed on the first insulating layer 111a. Then, the second vias 113b penetrating through the second insulating layer 111b may be formed. In addition, the third redistribution layer 112c may be formed on the second insulating layer 111b. A method of forming the second vias 113b and the third redistribution layer 112c may be the same as that described above. Then, the carrier film 301 may be peeled off. In this case, the peel-off may indicate that the metal layers 302 and 303 are separated from each other. Here, the metal layers may be separated from each other using a blade, but are not limited thereto. That is, all known methods may be used to separate the metal layers from each other. Meanwhile, an example in which the first interconnection member 110 is formed before the carrier film 301 is peeled off is described in a series of processes. However, the present disclosure is not limited thereto. For example, the first interconnection member 110 may also be formed according to the process described above after the carrier film 301 is peeled off. That is, a sequence is not necessarily limited to the abovementioned sequence.

Figure 14:
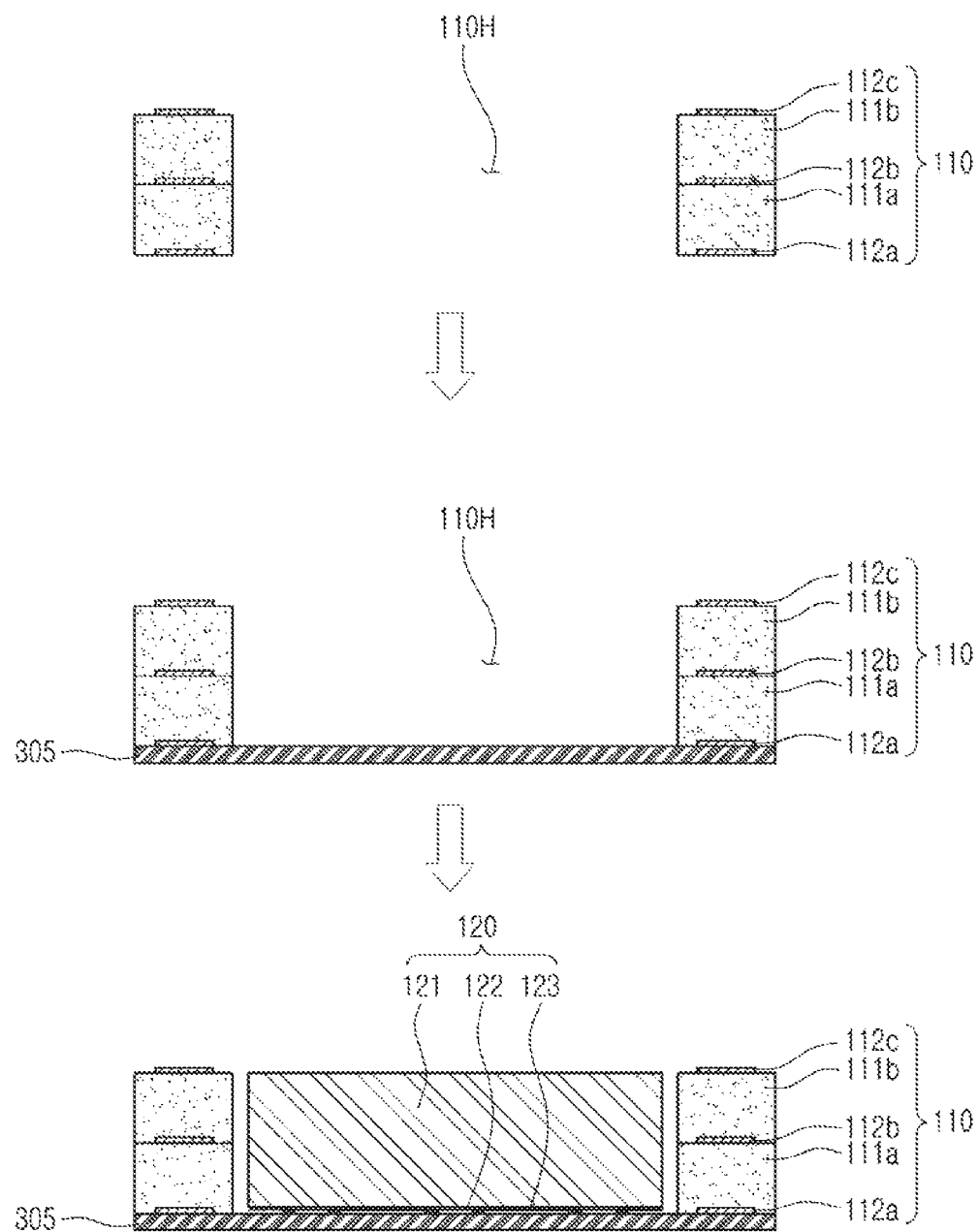

Referring to FIG. 14, then, the remaining metal layer 303 may be removed by a known etching method, or the like, and the through-hole 110H may be formed in the first interconnection member 110. The through-hole 110H may be formed using mechanical drilling or laser drilling. However, the through-hole 110H is not limited thereto, and may also be formed by a sand blasting method using particles for polishing, a dry etching method using plasma, or the like. In a case in which the through-hole 110H is formed using mechanical drilling or laser drilling, a desmearing process such as a permanganate method, or the like, may be performed to remove resin smear in the through-hole 110H. Next, an adhesive film 305 may be attached on one surface of the first interconnection member 110. Any material that may fix the first interconnection member 110 may be used as the adhesive film 305. As a non-restrictive example, a known tape, or the like, may be used. An example of the known tape may include a thermosetting adhesive tape of which adhesion is weakened by heat treatments, an ultraviolet-curable adhesive tape of which adhesion is weakened by ultraviolet ray irradiation, or the like. Then, the semiconductor chip 120 may be disposed in the through-hole 110H of the first interconnection member 110. For example, the semiconductor chip 120 may be disposed by a method of attaching the semiconductor chip 120 to the adhesive film 305 in the through-hole 110H. The semiconductor chip 120 may be disposed in a face-down form so that the connection pads 122 are attached to the adhesive film 305.

Figure 15:
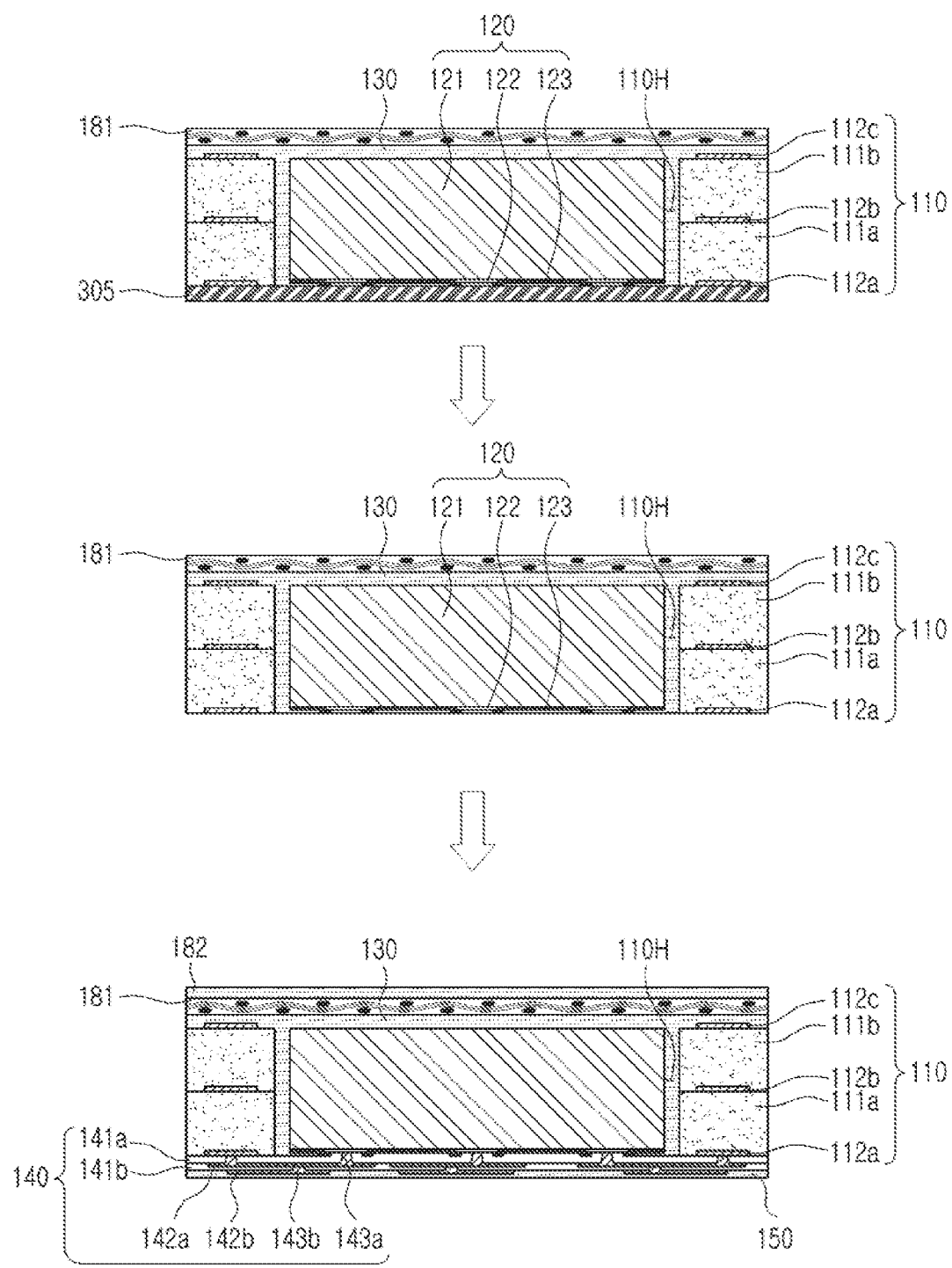

Referring to FIG. 15, then, the semiconductor chip 120 may be encapsulated using the encapsulant 130. The encapsulant 130 may cover the first interconnection member 110 and the inactive surface of the semiconductor chip 120, and may fill a space within the through-hole 110H. The encapsulant 130 may be formed by a known method. For example, the encapsulant 130 may be formed by a method of laminating a resin for forming the encapsulant 130 in a non-hardened state and then hardening the resin. Alternatively, the encapsulant 130 may be formed by a method of applying a resin for forming the encapsulant 130 in a non-hardened state on the adhesive film 305 to encapsulate the first interconnection member 110 and the semiconductor chip 120 and then hardening the resin. The semiconductor chip 120 may be fixed by hardening. As the method of laminating the resin, for example, a method of performing a hot press process of compressing the resin for a predetermined time at a high temperature, decompressing the resin, and then cooling the resin to room temperature, cooling the resin in a cold press process, and then separating a work tool, or the like, may be used. As the method of applying the resin, for example, a screen printing method of applying ink with a squeegee, a spray printing method of applying ink in a mist form, or the like, may be used. Then, the reinforcing layer 181 may be formed on the encapsulant 130. The reinforcing layer 181 may be attached in a hardened state (a c-stage) such as an unclad CCL, or the like, to the encapsulant 130. Therefore, a boundary surface between the encapsulant 130 and the reinforcing layer 181 may have an approximately linear form after the reinforcing layer 181 is attached to the encapsulant 130. The encapsulant 130 may be hardened after the reinforcing layer 181 is attached to the encapsulant 130. In this case, the reinforcing layer 181 may control warpage due to hardening contraction of the encapsulant 130. In addition, in this case, close adhesion between the reinforcing layer 181 and the encapsulant 130 may be excellent. Then, the adhesive film 305 may be peeled off. A method of peeling the adhesive film off is not particularly limited, but may be a known method. For example, in a case in which the thermosetting adhesive tape of which adhesion is weakened by heat treatment, the ultraviolet-curable adhesive tape of which adhesion is weakened by ultraviolet ray irradiation, or the like, is used as the adhesive film 305, the adhesive film 305 may be peeled off after the adhesion of the adhesive film 305 is weakened by heat-treating the adhesive film 305 or may be peeled off after the adhesion of the adhesive film 305 is weakened by irradiating the adhesive film 305 with ultraviolet light. Then, the second interconnection member 140 may be formed on the first interconnection member 110 and the active surface of the semiconductor chip 120 from which the adhesive film 305 is removed. The second interconnection member 140 may be formed by sequentially forming the insulating layers 141a and 141b and then forming the redistribution layers 142a and 142b and the vias 143a and 143b on and in the insulating layers 141a and 141b, respectively, by the plating process as described above, or the like. In addition, the resin layer 182 may be formed on the reinforcing layer 181. In addition, the passivation layer 150 may be formed on the second interconnection member 140. The resin layer 182 and the passivation layer 150 may also be formed by a method of laminating precursors of the resin layer 182 and the passivation layer 150 and then hardening the precursors, a method of applying materials for forming the resin layer 182 and the passivation layer 150 and then hardening the materials, or the like.

Figure 16:
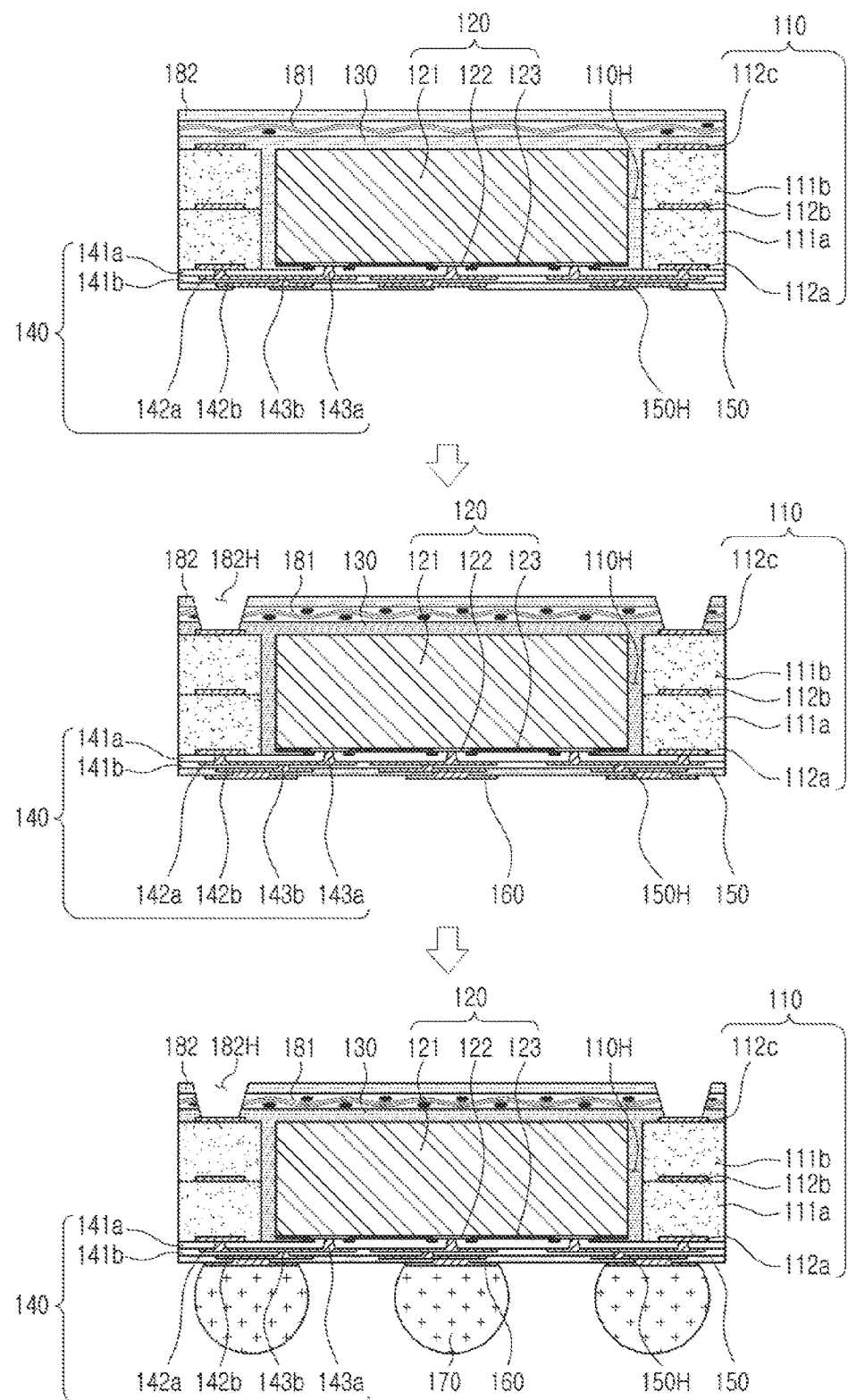

Referring to FIG. 16, then, the openings 150H may be formed in the passivation layer 150 to expose at least portions of the redistribution layer 142b of the second interconnection member 140, and the under-bump metal layer 160 may be formed in the openings 150H by a known metallization method. In addition, the openings 182H penetrating through the encapsulant 130, the reinforcing layer 181, and the resin layer 182 and exposing at least portions of the third redistribution layer 112c of the first interconnection member 110 may be formed. The openings 182H may be formed by mechanical drilling, laser drilling, a sand blasting method using particles for polishing, a dry etching method using plasma, or the like. Then, the connection terminals 170 may be formed on the under-bump metal layer 160. A method of forming the connection terminals 170 is not particularly limited. That is, the connection terminals 170 may be formed by the method well-known in the related art depending on a structure or a form thereof. The connection terminals 170 may be fixed by reflow, and portions of the connection terminals 170 may be embedded in the passivation layer 150 in order to enhance fixing force, and the remaining portions of the connection terminals 170 may be externally exposed, such that reliability may be improved.

Meanwhile, a series of processes may be processes of preparing the carrier film 301 having a large size, manufacturing a plurality of fan-out semiconductor packages 100A, and then singulating the plurality of fan-out semiconductor packages into individual fan-out semiconductor packages 100A through a cutting process in order to facilitate mass production. In this case, productivity may be excellent.

Figure 17:
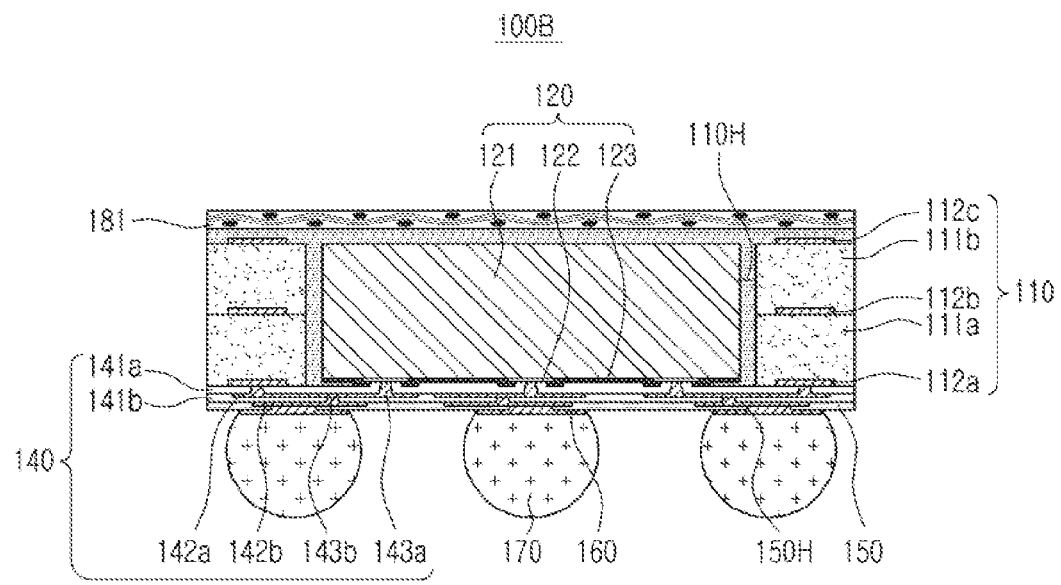
FIG. 17 is a schematic cross-sectional view illustrating another example of a fan-out semiconductor package.

FIG. 17 is a schematic cross-sectional view illustrating another example of a fan-out semiconductor package.

Referring to the drawing, in a fan-out semiconductor package 100B according to another exemplary embodiment in the present disclosure, only a reinforcing layer 181 may be attached to an encapsulant 130. Even in a case in which a separate resin layer 182, or the like, is not attached to the reinforcing layer 181 as described above, warpage may be controlled. The reinforcing layer 181 may be formed of, for example, an unclad CCL, prepreg, or the like, including a core material, an inorganic filler, and an insulating resin. The reinforcing layer 181 may have an elastic modulus relatively greater than that of the encapsulant 130, and may have a CTE smaller than that of the encapsulant 130. In this case, a warpage suppression effect may be particularly good. The reinforcing layer 181 may be attached in a hardened state (a c-stage) to the encapsulant 130. In this case, a boundary surface between the encapsulant 130 and the reinforcing layer 181 may have an approximately linear shape.

A description, or the like, of configurations other than the abovementioned configuration may overlap the description provided above, and is thus omitted. In addition, a description of processes of manufacturing the fan-out semiconductor package 100B in which the resin layer 182 is not formed may overlap the description provided above, and is thus omitted.

Figure 18:
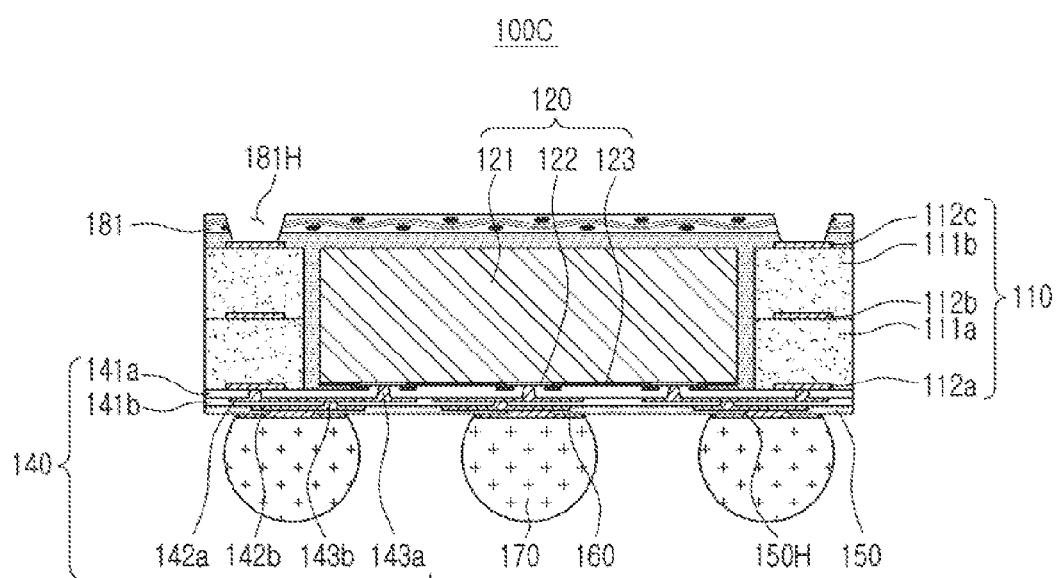
FIG. 18 is a schematic cross-sectional view illustrating another example of a fan-out semiconductor package.

FIG. 18 is a schematic cross-sectional view illustrating another example of a fan-out semiconductor package.

Referring to the drawing, in a fan-out semiconductor package 100C according to another exemplary embodiment in the present disclosure, only a reinforcing layer 181 may be attached to an encapsulant 130. In this case, openings 181H penetrating through the encapsulant 130 and the reinforcing layer 181 and exposing at least portions of a third redistribution layer 112c of a first interconnection member 110 may be formed in the reinforcing layer 181. Even in a case in which a separate resin layer 182, or the like, is not attached to the reinforcing layer 181 as described above, the openings 181H may be formed in the reinforcing layer 181. However, in this case, it may be more difficult to form the openings 181H than in a case in which the resin layer 182 is present, due to characteristics of a material of the reinforcing layer 181 including a core material. In addition, the core material of the reinforcing layer 181 may be exposed to walls of the openings 181H, and an additional process for removing the exposed core material may thus be required. The reinforcing layer 181 may be attached to the encapsulant 130 in a hardened state (a c-stage). In this case, a boundary surface between the encapsulant 130 and the reinforcing layer 181 may have an approximately linear shape.

A description, or the like, of configurations other than the abovementioned configuration may overlap the description provided above, and is thus omitted. In addition, a description of processes of manufacturing the fan-out semiconductor package 100C in which the resin layer 182 is not formed may overlap the description provided above, and is thus omitted.

Figure 19:
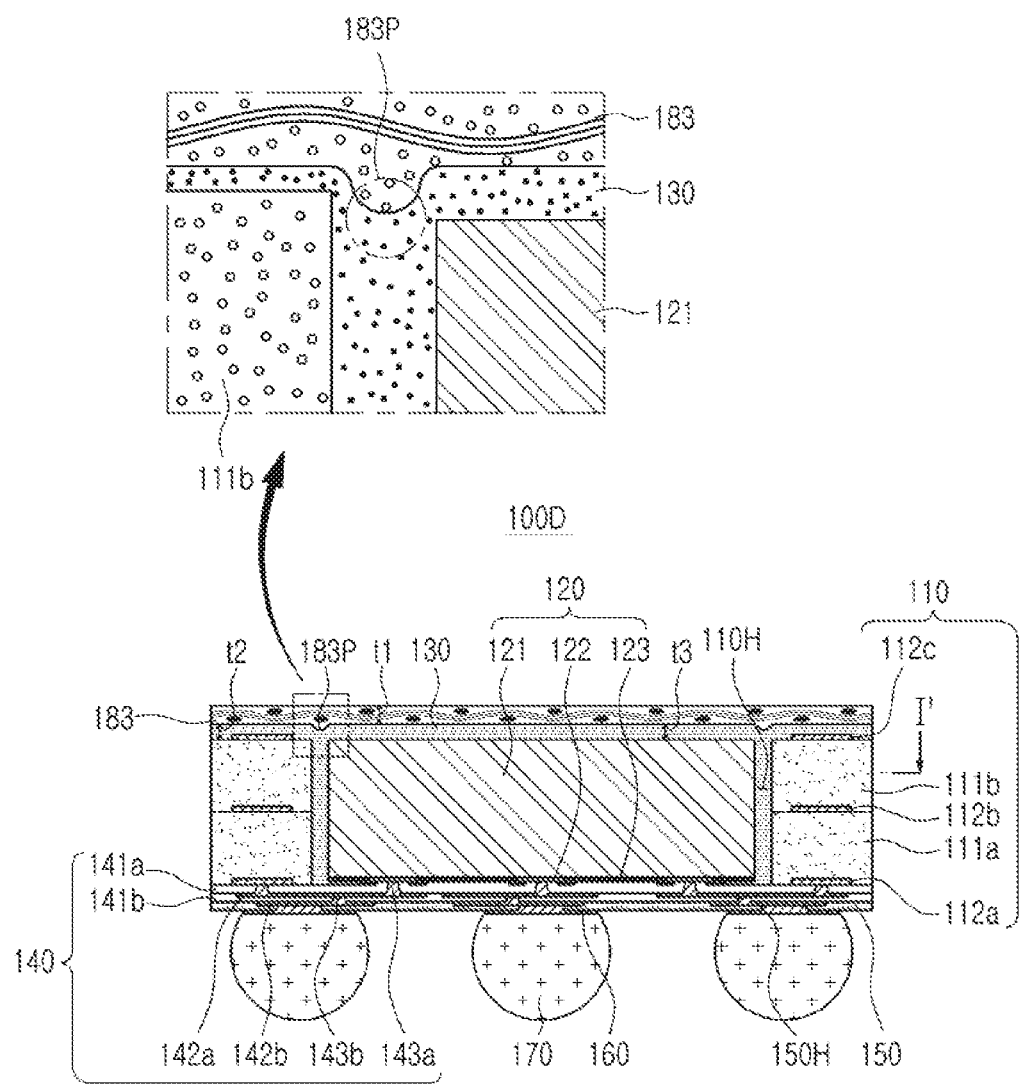
FIG. 19 is a schematic cross-sectional view illustrating another example of a fan-out semiconductor package.

FIG. 19 is a schematic cross-sectional view illustrating another example of a fan-out semiconductor package.

Referring to the drawing, in a fan-out semiconductor package 100D according to another exemplary embodiment in the present disclosure, a reinforcing layer 183 may be formed of, for example, prepreg, or the like, including a core material, an inorganic filler, and an insulating resin, and an encapsulant 130 may be formed of, for example, ABF, or the like, that includes an inorganic filler and an insulating resin, but does not include a core material. In this case, when a weight percentage of the inorganic filler included in the encapsulant 130 is a1 and a weight percentage of the inorganic filler included in the reinforcing layer 183 is a2, a1<a2. For example, 1.10<a2/a1<1.95. That is, the reinforcing layer 183 of which a concentration of the inorganic filler is relatively high may have a relatively low CTE, and the encapsulant 130 of which a concentration of the inorganic filler is relatively low may have a relatively high CTE. Therefore, the encapsulant 130 may have excellent resin flowability, and the reinforcing layer 183 may be advantageous in controlling warpage. In addition, when a thickness of the reinforcing layer 183 is t1, a thickness of a portion of the encapsulant 130 covering a first interconnection member 110 is t2, and a thickness of a portion of the encapsulant 130 covering an inactive surface of a semiconductor chip 120 is t3, t2<t1, and t3<t1. For example, 0.2<t2/t1<0.6, and 0.2<t3/t1<0.6. That is, the thickness of the reinforcing layer 183 may be greater than those of the portions of encapsulant 130 covering the first interconnection member 110 and the inactive surface of the semiconductor chip 120, which may be more advantageous in controlling warpage.

Meanwhile, the reinforcing layer 183 may be attached to the encapsulant 130 in a non-hardened state and be then hardened. Therefore, a material of the reinforcing layer 183 having a relatively small CTE may permeate into a through-hole 110H due to movement of a mixing or boundary surface between heterogeneous materials in contact with each other. For example, the prepreg, or the like, including the core material, the inorganic filler, and the insulating resin may be attached to the encapsulant 130 in a semi-hardened state in an b-stage and may then be hardened by the subsequent process in a c-stage, such that the reinforcing layer 183 may be formed. In this case, a mixing or boundary surface between materials may move due to a difference between concentrations of the inorganic fillers of the reinforcing layer 183 and the encapsulant 130. Resultantly, the boundary surface between the encapsulant 130 and the reinforcing layer 183 may have a non-linear shape. For example, the boundary surface between the encapsulant 130 and the reinforcing layer 183 may have curved portions 183P bent toward spaces between walls of the through-hole 110H of the first interconnection member 110 and the semiconductor chip 120. In this case, a contact area between the reinforcing layer 183 and the encapsulant 130 may be increased, such that close adhesion between the reinforcing layer 183 and the encapsulant 130 may be further improved.

A description, or the like, of configurations other than the abovementioned configuration may overlap the description provided above, and is thus omitted. In addition, a description of processes of manufacturing the fan-out semiconductor package 100D in which a resin layer 182 is not formed and the reinforcing layer 183 of which a material and a hardened state are different from those of the reinforcing layer 181 described above overlaps descriptions provided above, and is thus omitted.

Figure 20:
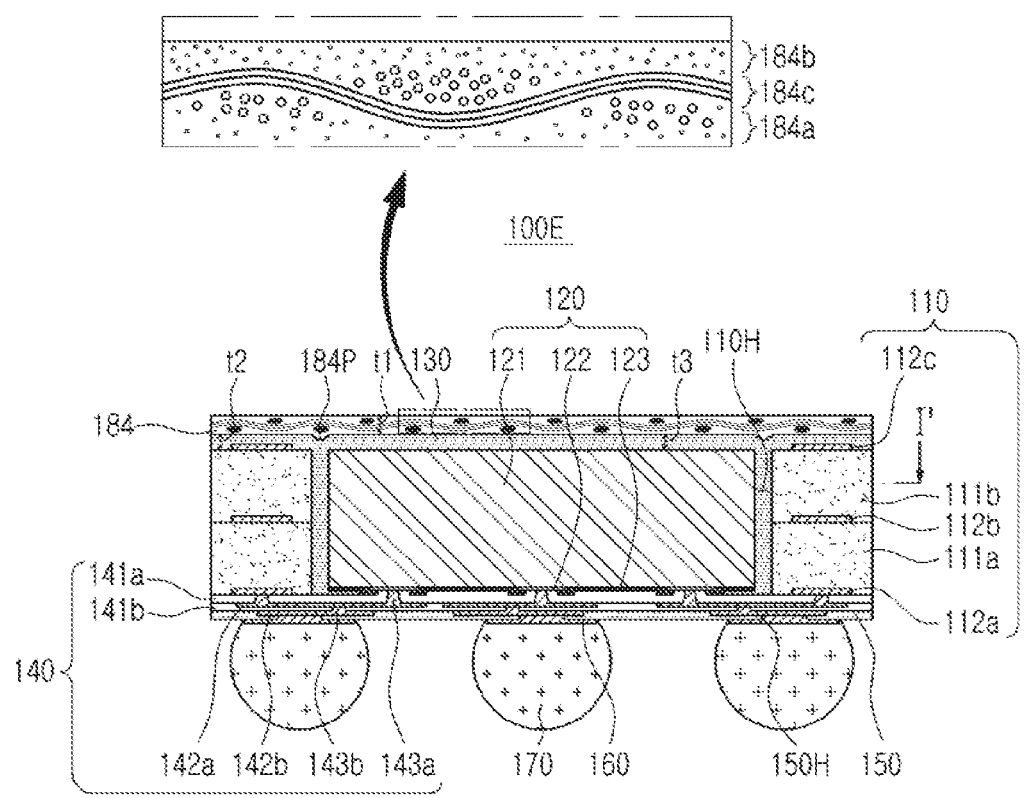
FIG. 20 is a schematic cross-sectional view illustrating another example of a fan-out semiconductor package.

FIG. 20 is a schematic cross-sectional view illustrating another example of a fan-out semiconductor package.

Referring to the drawing, in a fan-out semiconductor package 100E according to another exemplary embodiment in the present disclosure, a reinforcing layer 184 may be formed of, for example, asymmetrical prepreg, or the like, which includes a core material, an inorganic filler, and an insulating layer, and in which a weight percentage of inorganic filler included in one side 184a of the reinforcing layer 184 in contact with an encapsulant 130 and a weight percentage of inorganic filler included in the other side 184b of the reinforcing layer 184 opposing one side 184a in relation to the core material 184c are different from each other. The encapsulant 130 may be formed of, for example, ABF, or the like, including an inorganic filler and an insulating resin, but not including a core material. In this case, when a weight percentage of the inorganic filler included in the encapsulant 130 is a1, a weight percentage of the inorganic filler included in one side 184a of the reinforcing layer 184 in contact with the encapsulant 130 is a2, and a weight percentage of the inorganic filler included in the other side 184b of the reinforcing layer 184 opposing one side 184a is a3, a1<a2<a3. For example, 1.10<a3/a1<1.95. That is, a CTE of the other side 184b of the reinforcing layer 184 may be lowest, a CTE of one side 184a of the reinforcing layer 184 may be intermediate, and a CTE of the encapsulant 130 may be highest. Therefore, the encapsulant 130 may have excellent resin flowability, one side 184a of the reinforcing layer 184 may secure excellent close adhesion with the encapsulant 130, and the other side 184b of the reinforcing layer 184 may effectively control warpage. In addition, when a thickness of the reinforcing layer 184 is t1, a thickness of a portion of the encapsulant 130 covering a first interconnection member 110 is t2, and a thickness of a portion of the encapsulant 130 covering an inactive surface of a semiconductor chip 120 is t3, t2<t1, and t3<t1. For example, 0.2<t2/t1<0.6, and 0.2<t3/t1<0.6. In this case, warpage may be more easily controlled.

Meanwhile, the reinforcing layer 184 may be attached, in a non-hardened state, to the encapsulant 130, in a semi-hardened state, and then hardened. Therefore, a material of the reinforcing layer 184 having a relatively small CTE may permeate into a through-hole 110H due to movement of a mixing or boundary surface between heterogeneous materials in contact with each other. That is, for example, the asymmetrical prepreg, or the like, including the core material, the inorganic filler, and the insulating resin may be attached to the encapsulant 130 in a b-stage and may then be hardened by the subsequent process in a c-stage, such that the reinforcing layer 184 may be formed. In this case, a mixing or boundary surface between materials may move due to a difference between weight percentages of the inorganic fillers of one side 184a of the reinforcing layer 184 and the encapsulant 130. Resultantly, the boundary surface between the encapsulant 130 and the reinforcing layer 184 may have a non-linear shape. For example, portions of one side 184a of the reinforcing layer 184 may dimple toward the encapsulant 130 filling spaces between the first interconnection member 110 and the semiconductor chip 120 within the through-hole 110H of the first interconnection member 110, such that curved portions 184P may be formed. In this case, a contact area between the reinforcing layer 184 and the encapsulant 130 may be increased, such that close adhesion between the reinforcing layer 184 and the encapsulant 130 may be further improved.

A description, or the like, of configurations other than the abovementioned configuration may overlap the description provided above, and is thus omitted. In addition, a description of processes of manufacturing the fan-out semiconductor package 100E in which a resin layer 182 is not formed and the reinforcing layer 184 of which a material and a hardened state are different from those of the reinforcing layer 181 described above overlaps descriptions provided above, and is thus omitted.

Figure 21:
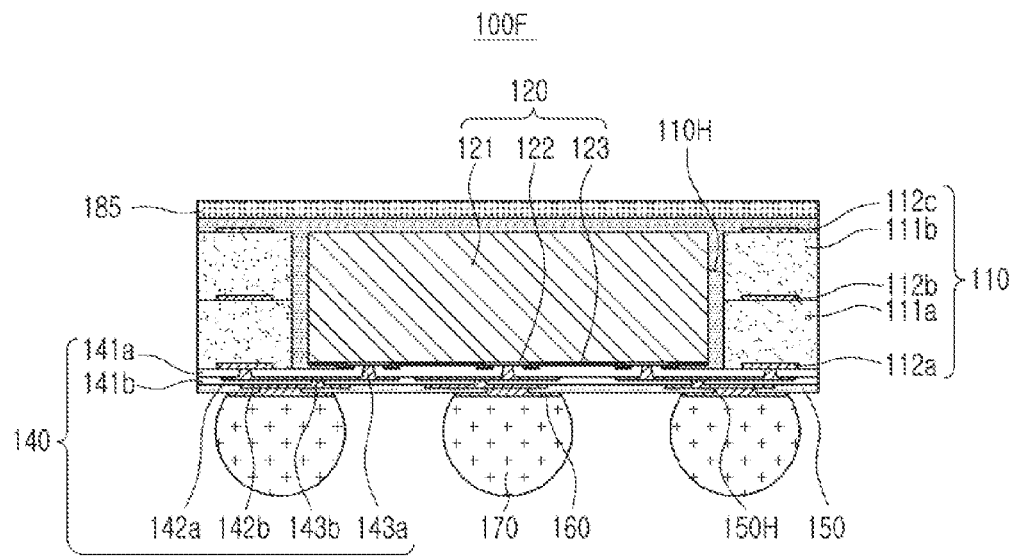
FIG. 21 is a schematic cross-sectional view illustrating another example of a fan-out semiconductor package.

FIG. 21 is a schematic cross-sectional view illustrating another example of a fan-out semiconductor package.

Referring to the drawing, in a fan-out semiconductor package 100F according to another exemplary embodiment in the present disclosure, only a reinforcing layer 185 may be attached to an encapsulant 130. In this case, the reinforcing layer 185 may be formed of, for example, ABF, or the like, that includes an inorganic filler and an insulating resin, but does not include a core material. In addition, the encapsulant 130 may also be formed of, for example, ABF, or the like, that includes an inorganic filler and an insulating resin, but does not include a core material. However, the reinforcing layer 185 may have an elastic modulus greater than that of the encapsulant 130 or a CTE smaller than that of the encapsulant 130 to suppress warpage. The reinforcing layer 185 may be attached to the encapsulant 130 in a hardened state (a c-stage). In this case, a boundary surface between the encapsulant 130 and the reinforcing layer 185 may have an approximately linear shape.

A description, or the like, of configurations other than the abovementioned configuration may overlap the description provided above, and is thus omitted. In addition, a description of processes of manufacturing the fan-out semiconductor package 100F in which a resin layer 182 is not formed and the reinforcing layer 185 of which a material and a hardened state are different from those of the reinforcing layer 181 described above overlaps descriptions provided above, and is thus omitted.

Figure 22:
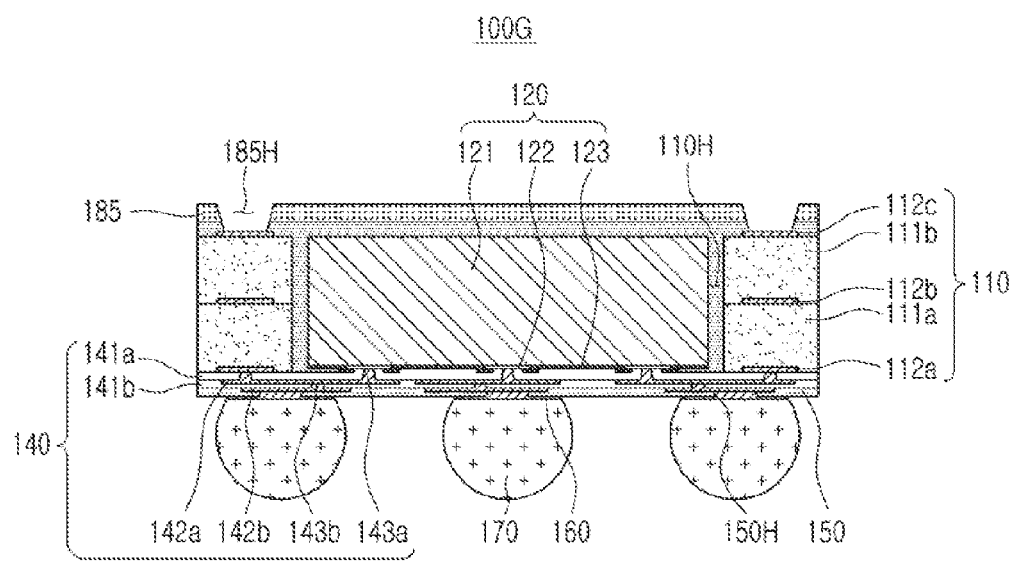
FIG. 22 is a schematic cross-sectional view illustrating another example of a fan-out semiconductor package.

FIG. 22 is a schematic cross-sectional view illustrating another example of a fan-out semiconductor package.

Referring to the drawing, in a fan-out semiconductor package 100G according to another exemplary embodiment in the present disclosure, only a reinforcing layer 185 may be attached to an encapsulant 130. In this case, openings 185H penetrating through the reinforcing layer 185 and exposing at least portions of a third redistribution layer 112c of a first interconnection member 110 may be formed in the reinforcing layer 185. In a case in which the reinforcing layer 185 does not include a core material, the openings 185H may be easily formed. The reinforcing layer 185 may be attached in a hardened state (a c-stage) to the encapsulant 130, and a boundary surface between the encapsulant 130 and the reinforcing layer 185 may thus have an approximately linear shape.

A description, or the like, of configurations other than the abovementioned configuration may overlap the description provided above, and is thus omitted. In addition, a description of processes of manufacturing the fan-out semiconductor package 100G in which a resin layer 182 is not formed and the reinforcing layer 185 of which a material and a hardened state are different from those of the reinforcing layer 181 described above overlaps descriptions provided above, and is thus omitted.

Figure 23:
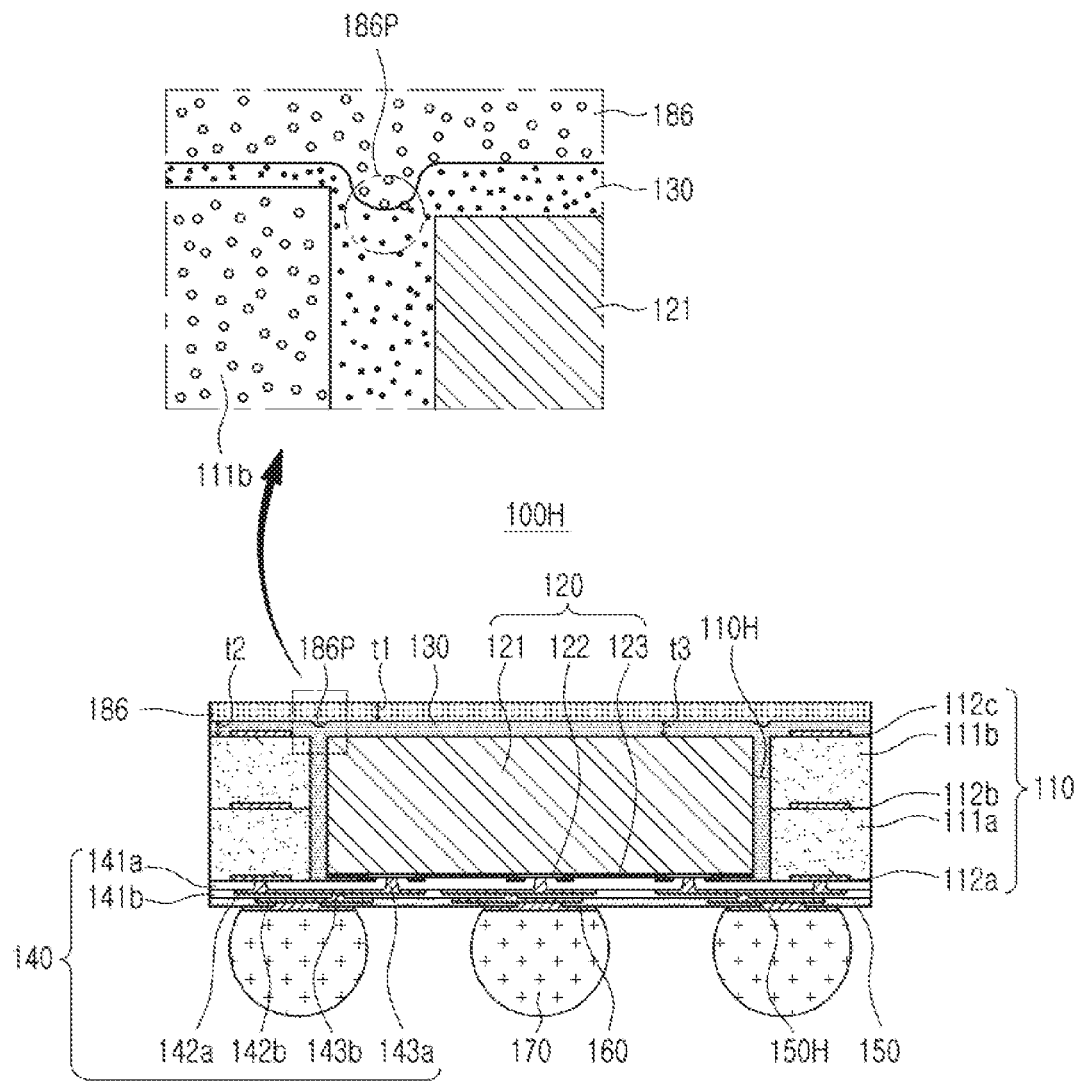
FIG. 23 is a schematic cross-sectional view illustrating another example of a fan-out semiconductor package.

FIG. 23 is a schematic cross-sectional view illustrating another example of a fan-out semiconductor package.

Referring to the drawing, in a fan-out semiconductor package 100H according to another exemplary embodiment in the present disclosure, a reinforcing layer 186 may be formed of, for example, ABF, or the like, that includes an inorganic filler and an insulating resin, but does not include a core material, and an encapsulant 130 may also be formed of, for example, ABF, or the like, that includes an inorganic filler and an insulating resin, but does not include a core material. In this case, when a weight percentage of the inorganic filler included in the encapsulant 130 is a1 and a weight percentage of the inorganic filler included in the reinforcing layer 186 is a2, a1<a2. For example, 1.10<a2/a1<1.95. That is, the reinforcing layer 186 of which a concentration of the inorganic filler is relatively high may have a relatively low CTE, and the encapsulant 130 of which a concentration of the inorganic filler is relatively low may have a relatively high CTE. Therefore, the encapsulant 130 may have excellent resin flowability, and the reinforcing layer 186 may be advantageous in controlling warpage. In addition, when a thickness of the reinforcing layer 186 is t1, a thickness of a portion of the encapsulant 130 covering a first interconnection member 110 is t2, and a thickness of a portion of the encapsulant 130 covering an inactive surface of a semiconductor chip 120 is t3, t2<t1, and t3<t1. For example, 0.2<t2/t1<0.6, and 0.2<t3/t1<0.6. That is, the thickness of the reinforcing layer 186 may be greater than those of the encapsulant 130 covering the first interconnection member 110 and the inactive surface of the semiconductor chip 120, which may be more advantageous in controlling warpage.

Meanwhile, the reinforcing layer 186 may be attached, in a non-hardened state, to the encapsulant 130, in a semi-hardened state, and then hardened. Therefore, a material of the reinforcing layer 186 having a relatively small CTE may permeate into a through-hole 110H due to movement of a mixing or boundary surface between heterogeneous materials in contact with each other. That is, for example, the ABF, or the like, that includes the inorganic filler and the insulating resin, but does not include a glass cloth may be attached in a b-stage to the encapsulant 130 and be then hardened in a c-stage by the subsequent process, such that the reinforcing layer 186 may be formed. In this case, a mixing or boundary surface between materials may move due to a difference between weight percentages of the inorganic fillers of the reinforcing layer 186 and the encapsulant 130. Resultantly, the boundary surface between the encapsulant 130 and the reinforcing layer 186 may have an approximately non-linear shape. For example, portions of the reinforcing layer 186 may dimple toward the encapsulant 130 filling spaces between the first interconnection member 110 and the semiconductor chip 120 within the through-hole 110H of the first interconnection member 110, such that curved portions 186P may be formed. In this case, a contact area between the reinforcing layer 186 and the encapsulant 130 may be increased, such that close adhesion between the reinforcing layer 186 and the encapsulant 130 may be further improved.

A description, or the like, of configurations other than the abovementioned configuration may overlap the description provided above, and is thus omitted. In addition, a description of processes of manufacturing the fan-out semiconductor package 100H in which a resin layer 182 is not formed and the reinforcing layer 186 of which a material and a hardened state are different from those of the reinforcing layer 181 described above overlaps descriptions provided above, and is thus omitted.

Figure 24:
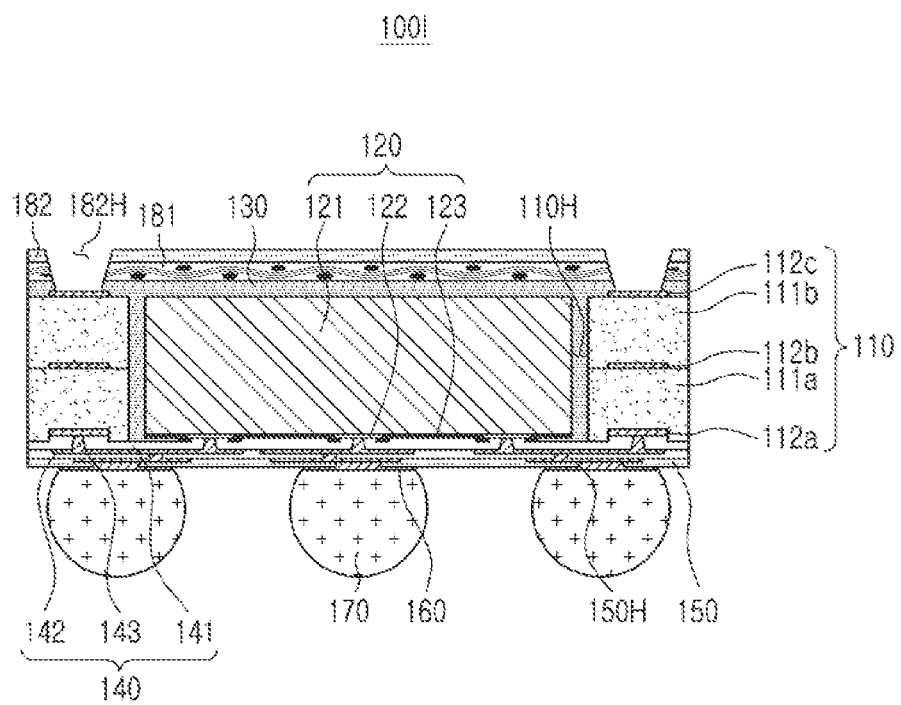
FIG. 24 is a schematic cross-sectional view illustrating another example of a fan-out semiconductor package.

FIG. 24 is a schematic cross-sectional view illustrating another example of a fan-out semiconductor package.

Referring to the drawing, in a fan-out semiconductor package 100I according to another exemplary embodiment in the present disclosure, a first redistribution layer 112a may be recessed in a first insulating layer 111a, such that a lower surface of the first insulating layer 111a may have a step portion with respect to a lower surface of the first redistribution layer 112a. Resultantly, when an encapsulant 130 is formed, a phenomenon in which a material of the encapsulant 130 bleeds to pollute the first redistribution layer 112a may be prevented. Meanwhile, since the first redistribution layer 112a is recessed in the first insulating layer 111a as described above, a lower surface of the first redistribution layer 112a of a first interconnection member 110 may be disposed on a level above a lower surface of a connection pad 122 of a semiconductor chip 120. In addition, a distance between a redistribution layer 142a of a second interconnection member 140 and the first redistribution layer 112a of the first interconnection member 110 may be greater than that between the redistribution layer 142a of the second interconnection member 140 and the connection pad 122 of the semiconductor chip 120.

A description, or the like, of configurations other than the abovementioned configuration may overlap the description provided above, and is thus omitted. In addition, a description of processes of manufacturing the fan-out semiconductor package 100I in which the step portion is formed by partially removing the first redistribution layer 112a at the time of removing a metal layer 303 may overlap the description provided above, and is thus omitted. Meanwhile, the features of the fan-out semiconductor packages 100B to 100H may also be applied to the fan-out semiconductor package 100I.

Figure 25:
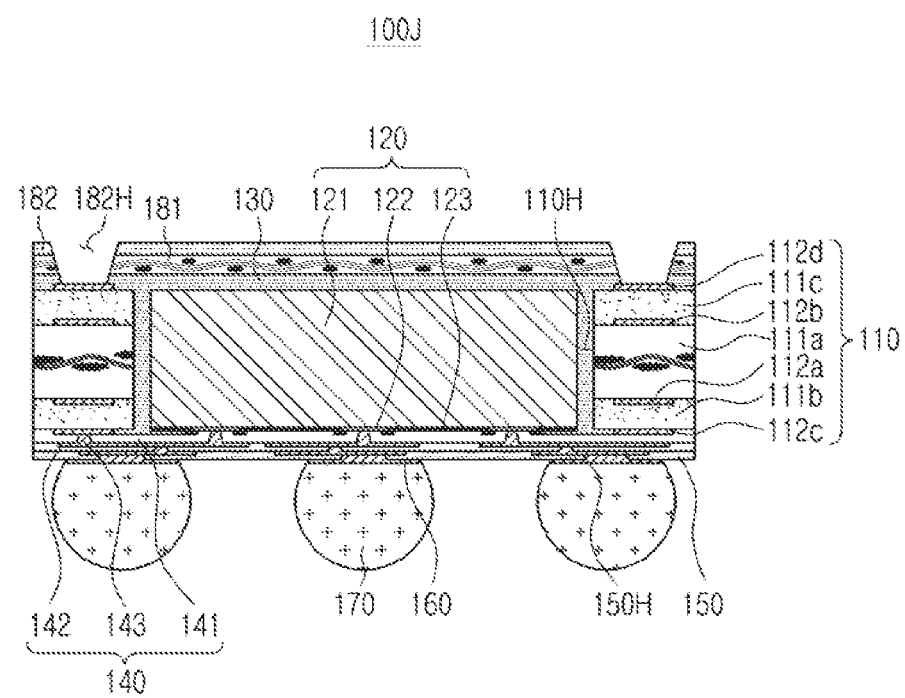
FIG. 25 is a schematic cross-sectional view illustrating another example of a fan-out semiconductor package.

FIG. 25 is a schematic cross-sectional view illustrating another example of a fan-out semiconductor package.

Referring to the drawing, in a fan-out semiconductor package 100J according to another exemplary embodiment in the present disclosure, a first interconnection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122 of a semiconductor chip 120. Since the first interconnection member 110 may include a larger number of redistribution layers 112a, 112b, 112c, and 112d, a second interconnection member 140 may be further simplified. Therefore, a decrease in a yield depending on a defect occurring in a process of forming the second interconnection member 140 may be improved. Meanwhile, although not illustrated in the drawing, the first to fourth redistribution layers 112a, 112b, 112c, and 112d may be electrically connected to each other by first to third vias penetrating through the first to third insulating layers 111a, 111b, and 111c.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto.

A lower surface of the third redistribution layer 112c of the first interconnection member 110 may be disposed on a level below a lower surface of the connection pads 122 of the semiconductor chip 120. In addition, a distance between a redistribution layer 142 of the second interconnection member 140 and the third redistribution layer 112c of the first interconnection member 110 may be smaller than that between the redistribution layer 142 of the second interconnection member 140 and the connection pads 122 of the semiconductor chip 120. Here, the third redistribution layer 112c may be disposed in a protruding form on the second insulating layer 111b, resulting in contact with the second interconnection member 140. The first redistribution layer 112a and the second redistribution layer 112b of the first interconnection member 110 may be disposed on a level between an active surface and an inactive surface of the semiconductor chip 120. The first interconnection member 110 may be formed to a thickness corresponding to that of the semiconductor chip 120. Therefore, the first redistribution layer 112a and the second redistribution layer 112b formed in the first interconnection member 110 may be disposed on a level between the active surface and the inactive surface of the semiconductor chip 120.

Thicknesses of the redistribution layers 112a, 112b, 112c, and 112d of the first interconnection member 110 may be greater than that of the redistribution layer 142 of the second interconnection member 140. Since the first interconnection member 110 may have a thickness equal to or greater than that of the semiconductor chip 120, the redistribution layers 112a, 112b, 112c, and 112d may also be formed to be large. On the other hand, the redistribution layer 142 of the second interconnection member 140 may be formed to have a relatively small size for thinness.

A description, or the like, of configurations other than the abovementioned configuration may overlap the description provided above, and is thus omitted. In addition, a description of processes of manufacturing the fan-out semiconductor package 100J except for a configuration of a first interconnection member 110 may overlap the description provided above, and is thus omitted. Meanwhile, the features of the fan-out semiconductor packages 100B to 100H may also be applied to the fan-out semiconductor package 100J.

FIG. 26 is schematic views illustrating a case in which warpage is generated in a fan-out semiconductor package.

Referring to the drawing, a thermosetting resin film that may firmly fix a first interconnection member 510 including an insulating layer 511, redistribution layers 512a and 512b, vias 513, and the like, and a semiconductor chip 520 including a body 521, electrode pads 522, and the like, may be used as a material of an encapsulant 530 encapsulating the first interconnection member 510 and the semiconductor chip 520. In detail, the thermosetting resin film having a high CTE, generally having good resin flowability, may be used to form the encapsulant 530, in order to completely fill a space of a through-hole 510H between the first interconnection member 510 and the semiconductor chip 520 with a resin and increase close adhesion between the first interconnection member 510 and the semiconductor chip 520. However, it may be appreciated that in this thermosetting resin film, heat-hardening contraction of the resin is large, such that warpage W1 is severely generated in a package after the resin is hardened. Therefore, it may be difficult to form fine circuit patterns later.

FIG. 27 is schematic views illustrating a case in which warpage of a fan-out semiconductor package is suppressed.

FIG. 28 is schematic views illustrating additional problems occurring in FIG. 27.

Referring to the drawings, it may be considered that a thermosetting resin film having a low CTE is used as a material of an encapsulant 540 encapsulating a first interconnection member 510 including an insulating layer 511, redistribution layers 512a and 512b, vias 513, and the like, and a semiconductor chip 510 including a body 521, electrode pads 522, and the like. It may be appreciated that in a case of using the thermosetting resin film having the low CTE as the material of the encapsulant 540, warpage W2 is suppressed as compared to in a case of using a thermosetting resin film having a high CTE. However, a content of inorganic filler in the thermosetting resin film is generally increased in order to reduce a CTE, such that a resin does not sufficiently fill a fine space due to a reduction in resin flowability, which causes a void, or the like. In addition, delamination between a first interconnection member and a semiconductor chip, or the like, may be generated due to a reduction in close adhesion between the first interconnection member and the semiconductor chip.

Figure 29:
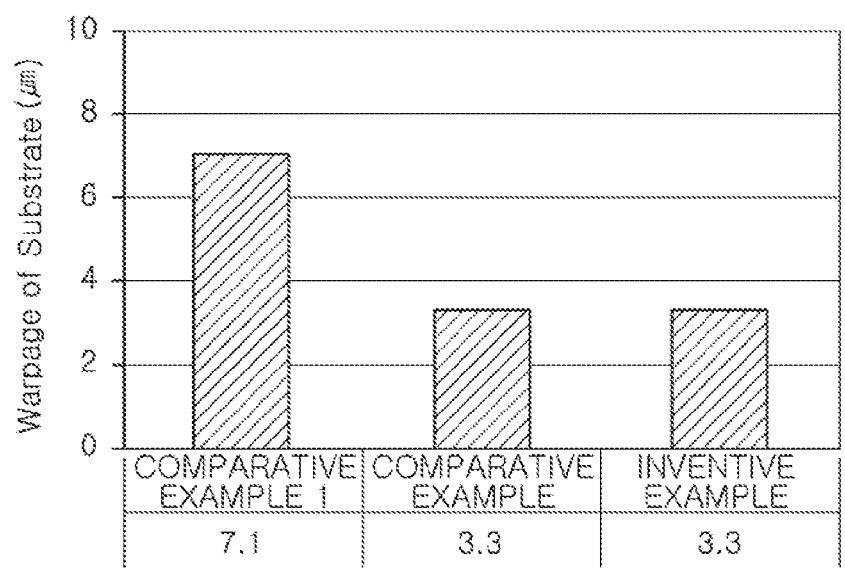
FIG. 29 is a graph for comparing warpage suppressing effects of fan-out semiconductor packages with one another.

FIG. 29 is a graph for comparing warpage suppressing effects of fan-out semiconductor packages with one another.

Referring to the drawing, Comparative Example 1 refers to a case in which a thermosetting resin film having a high CTE, having good resin flowability, is used as a material of an encapsulant as illustrated in FIG. 26. It may be appreciated that in Comparative Example 1, warpage is severely generated due to high heat-hardening contraction of the encapsulant. Comparative Example 2 refers to a case in which a thermosetting resin film having a low CTE is used as a material of an encapsulant in order to suppress warpage, as illustrated in FIG. 27. In Comparative Example 2, warpage might be suppressed due to low heat-hardening contraction of the encapsulant, but the problems such as the void, the delamination, and the like, as described above, have additionally occurred. The Inventive Example refers to a case in which a thermosetting resin film having a high CTE, having good resin flowability, is used as a material of an encapsulant and a reinforcing layer having an elastic modulus greater than that of the encapsulant and having a CTE smaller than that of the encapsulant is introduced on the encapsulant as in the present disclosure. In the Inventive Example, warpage might be suppressed at a level similar to that of Comparative Example 2 without causing problems such as voids and delamination.

As set forth above, according to the exemplary embodiment in the present disclosure, a fan-out semiconductor package in which a warpage problem may be effectively solved may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
    a semiconductor chip having an active surface having connection pads disposed thereon and an inactive surface opposing the active surface;
    a first interconnection member disposed on the active surface of the semiconductor chip:
    a second interconnection member having a through-hole, in which the semiconductor chip is disposed;
    an encapsulant including a first portion covering the inactive surface of the semiconductor chip and an upper surface of the second interconnection member, and a second portion extending from the first portion to fill at least a portion of the through-hole and cover side surfaces of the semiconductor chip and the second interconnection member; and
    a reinforcing layer disposed on the encapsulant,
    wherein the first interconnection member includes a redistribution layer electrically connected to the connection pads of the semiconductor chip,
    the first portion of the encapsulant is disposed between the reinforcing layer, and the inactive surface of the semiconductor chip and the upper surface of the second interconnection member, and
    the reinforcing layer has an elastic modulus greater than that of the encapsulant.

2. The fan-out semiconductor package of claim 1, wherein the reinforcing layer has a coefficient of thermal expansion lower than that of the encapsulant.

3. The fan-out semiconductor package of claim 1, wherein the reinforcing layer includes a core material, an inorganic filler, and an insulating resin.

4. The fan-out semiconductor package of claim 3, further comprising a resin layer disposed on the reinforcing layer,
    wherein the resin layer includes an inorganic filler and an insulating resin, and
    the reinforcing layer is disposed between the resin layer and the encapsulant.

5. The fan-out semiconductor package of claim 4, further comprising openings penetrating through the resin layer, the reinforcing layer, and the encapsulant.

6. The fan-out semiconductor package of claim 4, further comprising a passivation layer disposed on the first interconnection member,
    wherein the passivation layer includes an inorganic filler and an insulating resin, and
    the first interconnection member is disposed between the passivation layer and the semiconductor chip.

7. The fan-out semiconductor package of claim 6, wherein a composition of the resin layer and a composition of the passivation layer are the same as each other.

8. The fan-out semiconductor package of claim 3, wherein the encapsulant includes an inorganic filler and an insulating resin, and a weight percentage of the inorganic filler included in the reinforcing layer is greater than that of the inorganic filler included in the encapsulant.

9. The fan-out semiconductor package of claim 8, wherein a weight percentage of the inorganic filler included in one side of the reinforcing layer in contact with the encapsulant and a weight percentage of the inorganic filler included in the other side of the reinforcing layer opposing the one side in relation to the core material are different from each other.

10. The fan-out semiconductor package of claim 9, wherein a1<a2<a3, in which a1 is the weight percentage of the inorganic filler included in the encapsulant, a2 is the weight percentage of the inorganic filler included in the one side of the reinforcing layer in contact with the encapsulant, and a3 is the weight percentage of the inorganic filler included in the other side of the reinforcing layer opposing the one side.

11. The fan-out semiconductor package of claim 1, wherein the reinforcing layer includes an inorganic filler and an insulating resin and does not include a core material.

12. The fan-out semiconductor package of claim 11, wherein the encapsulant includes an inorganic filler and an insulating resin, and a weight percentage of the inorganic filler included in the reinforcing layer is greater than that of the inorganic filler included in the encapsulant.

13. The fan-out semiconductor package of claim 1, further comprising a passivation layer disposed on the first interconnection member,
wherein the passivation layer includes an inorganic filler and an insulating resin, and
the first interconnection member is disposed between the passivation layer and the semiconductor chip.

14. The fan-out semiconductor package of claim 13, wherein the first interconnection member includes an insulating layer including an inorganic filler and an insulating resin, and a weight percentage of the inorganic filler included in the passivation layer is greater than that of the inorganic filler included in the insulating layer of the first interconnection member.

15. The fan-out semiconductor package of claim 1,
wherein
the second interconnection member includes a first insulating layer penetrated by the through-hole, a first redistribution layer in contact with the first interconnection member and embedded in the first insulating layer, and a second redistribution layer disposed on the other surface of the first insulating layer opposing one surface of the first insulating layer in which the first redistribution layer is embedded, and
the first and second redistribution layers are electrically connected to the connection pads.

16. The fan-out semiconductor package of claim 15, wherein the second interconnection member further includes:
a second insulating layer penetrated by the through-hole, disposed on the first insulating layer, and covering the second redistribution layer; and
a third redistribution layer disposed on the second insulating layer, and the third redistribution layer is electrically connected to the connection pads.

17. The fan-out semiconductor package of claim 16, wherein the second redistribution layer is disposed on a level between the active surface and the inactive surface of the semiconductor chip.

18. The fan-out semiconductor package of claim 15, wherein a distance between the redistribution layer of the first interconnection member and the first redistribution layer is greater than that between the redistribution layer of the first interconnection member and the connection pad.

19. The fan-out semiconductor package of claim 15, wherein the first redistribution layer has a thickness greater than that of the redistribution layer of the first interconnection member.

20. The fan-out semiconductor package of claim 15, wherein a lower surface of the first redistribution layer is disposed on a level above a lower surface of the connection pad.

21. The fan-out semiconductor package of claim 1,
wherein
the second interconnection member includes:
a first insulating layer penetrated by the through-hole, a first redistribution layer and a second redistribution layer disposed on opposite surfaces of the first insulating layer, respectively,
a second insulating layer penetrated by the through-hole, disposed on the first insulating layer, and covering the first redistribution layer, and
a third redistribution layer disposed on the second insulating layer, and the first to third redistribution layers are electrically connected to the connection pads.

22. The fan-out semiconductor package of claim 21, wherein the second interconnection member further includes:
a third insulating layer penetrated by the through-hole, disposed on the first insulating layer, and covering the second redistribution layer, and
a fourth redistribution layer disposed on the third insulating layer, and the fourth redistribution layer is electrically connected to the connection pads.

23. The fan-out semiconductor package of claim 21, wherein the first insulating layer has a thickness greater than that of the second insulating layer.

24. The fan-out semiconductor package of claim 21, wherein the third redistribution layer has a thickness greater than that of the redistribution layer of the first interconnection member.

25. The fan-out semiconductor package of claim 21, wherein the first redistribution layer is disposed on a level between the active surface and the inactive surface of the semiconductor chip.

26. The fan-out semiconductor package of claim 21, wherein a lower surface of the third redistribution layer is disposed on a level below a lower surface of the connection pad.

27. The fan-out semiconductor package of claim 1, wherein a boundary surface between the encapsulant and the reinforcing layer has an approximately linear shape.

28. The fan-out semiconductor package of claim 1,
wherein
the second interconnection member includes an insulating layer penetrated by the through-hole, a first redistribution layer disposed on a first surface of the insulating layer, and a second redistribution layer disposed on a second surface of the insulating layer opposing the first surface of the insulating layer, and
the first and second redistribution layers are electrically connected to the connection pads.

29. A fan-out semiconductor package comprising:
a semiconductor chip having an active surface having connection pads disposed thereon and an inactive surface opposing the active surface;
an encapsulant including a first portion covering the inactive surface of the semiconductor chip;
a first interconnection member disposed on the active surface of the semiconductor chip: and
a reinforcing layer disposed on the encapsulant; and
an insulating member having a through-hole,
wherein the first interconnection member includes a redistribution layer electrically connected to the connection pads of the semiconductor chip,
the first portion of the encapsulant is disposed between the reinforcing layer and the inactive surface of the semiconductor chip, the reinforcing layer has an elastic modulus greater than that of the encapsulant, the semiconductor chip is disposed in the through-hole of the insulating member, the encapsulant includes a second portion filling at least a portion of the through-hole and covering side surfaces of the semiconductor chip, and a boundary surface between the reinforcing layer and the encapsulant has curved portions bent toward spaces between inner walls of the through-hole and the semiconductor chip.

30. The fan-out semiconductor package of claim 29, wherein the reinforcing layer has a thickness greater than that a third portion of the encapsulant covering the insulating member and that of a first portion of the encapsulant covering the inactive surface of the semiconductor chip.

31. A semiconductor package comprising:
one or more insulating layers having a through-hole penetrating through the one or more insulating layers;

a semiconductor chip disposed in the through-hole and having an active surface having connection pads disposed thereon and an inactive surface opposing the active surface;

an encapsulant including a first portion disposed on one side of the semiconductor chip and the one or more insulating layers, and a second portion extending from the first portion and filling a portion of the through-hole to cover side surfaces of the semiconductor chip;

an interconnection member disposed on another side of the semiconductor chip and the one or more insulating layers opposing the one side of the semiconductor chip and the one or more insulating layers, and including a redistribution layer electrically connected to the connection pads of the semiconductor chip; and a reinforcing layer disposed on the encapsulant and having a dimple penetrated into a region of the encapsulant over the second portion of the encapsulant.

* * * * *